(12) United States Patent
Lanoe et al.

(10) Patent No.: US 10,593,502 B1
(45) Date of Patent: Mar. 17, 2020

(54) FUSIBLE CONTINUOUS SHIELDS FOR USE IN COMMUNICATION CABLES

(71) Applicant: Superior Essex International LP, Atlanta, GA (US)

(72) Inventors: Thibaut Oscar Lanoe, Atlanta, GA (US); Bernhart A. Gebs, Powder Springs, GA (US); Christopher W. McNutt, Woodstock, GA (US)

(73) Assignee: Superior Essex International LP, Atlanta, GA (US)

( * ) Notice: Subject to any disclaimer, the term of this patent is extended or adjusted under 35 U.S.C. 154(b) by 0 days.

(21) Appl. No.: 16/106,258

(22) Filed: Aug. 21, 2018

(51) Int. Cl.
*H01B 11/08* (2006.01)
*H01H 85/02* (2006.01)
*H05K 9/00* (2006.01)

(52) U.S. Cl.
CPC ......... *H01H 85/0241* (2013.01); *H01B 11/08* (2013.01); *H05K 9/0098* (2013.01)

(58) Field of Classification Search
CPC ................................ H01B 11/06; H01B 11/08
USPC .......................................................... 174/36
See application file for complete search history.

(56) References Cited

U.S. PATENT DOCUMENTS

| | | | |
|---|---|---|---|
| 2,538,019 A | 1/1951 | Lee | |
| 2,796,463 A | 6/1957 | Mallindrodt | |
| 3,090,825 A | 5/1963 | Volk | |
| 3,135,935 A | 6/1964 | Eugelbrecht | |
| 3,312,774 A | 4/1967 | Drinko | |
| 3,373,475 A | 3/1968 | Peterson | |
| 3,439,111 A | 4/1969 | Miracle | |
| 3,612,744 A | 10/1971 | Thomas | |
| 4,129,841 A | 12/1978 | Hildebrand et al. | |
| 4,327,946 A | 4/1982 | Kincaid | |
| 4,604,497 A | 8/1986 | Bell et al. | |
| 4,638,272 A | 1/1987 | Ive | |
| 4,746,767 A | 5/1988 | Gruhn | |
| 4,855,534 A | 8/1989 | O'Connor | |
| 4,881,642 A | 11/1989 | Adam | |
| 4,912,283 A | 3/1990 | O'Connor | |

(Continued)

FOREIGN PATENT DOCUMENTS

| | | |
|---|---|---|
| GB | 2432963 | 6/2007 |
| JP | 2000090748 | 3/2000 |

(Continued)

OTHER PUBLICATIONS

"Product Catalogue" 2 pages, Enterprise Cabling R&M, May 2006.

(Continued)

*Primary Examiner* — Chau N Nguyen

(57) ABSTRACT

Electrically continuous shielding elements for use in communication cables are described. A shielding element may include a base layer of dielectric material extending in a longitudinal direction, and a plurality of longitudinally spaced segments of electrically conductive material may be formed on the base layer. A respective fusible element may be positioned between each adjacent set of longitudinally spaced segments included in the plurality of longitudinally spaced segments. Each fusible element may provide electrical continuity between the adjacent set of longitudinally spaced segments, and each fusible element may have a minimum fusing current between 0.001 amperes and 0.500 amperes.

18 Claims, 11 Drawing Sheets

(56) References Cited

U.S. PATENT DOCUMENTS

| | | | |
|---|---|---|---|
| 5,006,806 A | 4/1991 | Rippingale | |
| 5,008,489 A | 4/1991 | Weeks et al. | |
| 5,106,175 A | 4/1992 | Davis et al. | |
| 5,114,517 A | 5/1992 | Rippingale et al. | |
| 5,300,899 A * | 4/1994 | Suski | H01P 3/085 |
| | | | 174/254 |
| 5,473,336 A | 12/1995 | Harman et al. | |
| 5,952,615 A | 9/1999 | Prudhon | |
| 5,956,445 A | 9/1999 | Deitz et al. | |
| 6,207,901 B1 | 3/2001 | Smith et al. | |
| 6,506,976 B1 | 1/2003 | Neveux, Jr. | |
| 6,677,518 B2 | 1/2004 | Hirakawa et al. | |
| 6,687,437 B1 | 2/2004 | Starnes et al. | |
| 6,723,925 B2 | 4/2004 | Ohara et al. | |
| 6,737,574 B2 | 5/2004 | Sylvia et al. | |
| 6,770,819 B2 | 8/2004 | Patel | |
| 6,831,231 B2 | 12/2004 | Perelman et al. | |
| 6,843,660 B2 * | 1/2005 | Barr | H01B 7/0009 |
| | | | 439/67 |
| 6,850,161 B1 | 2/2005 | Elliott | |
| 6,888,070 B1 | 5/2005 | Prescott | |
| 6,927,343 B2 * | 8/2005 | Watanabe | G01R 1/07314 |
| | | | 174/117 F |
| 6,972,493 B2 * | 12/2005 | Ushiyama | G06F 17/5077 |
| | | | 257/758 |
| 7,173,189 B1 | 2/2007 | Hazy et al. | |
| 7,179,999 B2 | 2/2007 | Clark et al. | |
| 7,208,683 B2 | 4/2007 | Clark | |
| 7,332,676 B2 | 2/2008 | Sparrowhawk | |
| 7,335,837 B2 | 2/2008 | Pfeiler et al. | |
| 7,600,723 B2 | 10/2009 | Borche | |
| 7,834,270 B2 | 11/2010 | Zhu et al. | |
| 7,923,632 B2 | 4/2011 | Smith et al. | |
| 7,923,641 B2 | 4/2011 | Smith et al. | |
| 8,119,906 B1 | 2/2012 | Smith et al. | |
| 8,445,787 B2 | 5/2013 | Nordin et al. | |
| 8,558,115 B2 | 10/2013 | Jenner et al. | |
| 9,241,400 B2 * | 1/2016 | Shaw | H05K 1/0253 |
| 9,424,964 B1 | 8/2016 | Kithuka et al. | |
| 9,767,939 B2 | 9/2017 | Hess | |
| 2005/0118391 A1 | 6/2005 | Kavvadias | |
| 2006/0048961 A1 | 3/2006 | Pfeiler et al. | |
| 2007/0037419 A1 | 2/2007 | Sparrowhawk | |
| 2007/0224495 A1 | 9/2007 | Gibbons et al. | |
| 2007/0275583 A1 | 11/2007 | McNutt et al. | |
| 2008/0255435 A1 | 10/2008 | Al-Ali et al. | |
| 2008/0314636 A1 | 12/2008 | Ogura | |
| 2009/0200060 A1 | 8/2009 | Smith et al. | |
| 2009/0223694 A1 | 9/2009 | Nordin et al. | |
| 2009/0272571 A1 | 11/2009 | Gromko | |
| 2010/0096179 A1 | 4/2010 | Sparrowhawk et al. | |
| 2010/0101853 A1 | 4/2010 | McNutt et al. | |
| 2010/0224385 A1 | 9/2010 | Jenner et al. | |
| 2011/0147039 A1 | 6/2011 | Smith et al. | |
| 2013/0140084 A1 * | 6/2013 | Sarangapani | H01R 4/029 |
| | | | 174/94 R |
| 2016/0037691 A1 | 2/2016 | Kroushl et al. | |

FOREIGN PATENT DOCUMENTS

| | | |
|---|---|---|
| JP | 2006173044 | 6/2006 |
| WO | WO2006105166 | 5/2006 |

OTHER PUBLICATIONS

"Draka" 12 pages, Draka Comtez, Cable Solutions, Data Cables, Sep. 27, 2006.

"10 Gigabit Ethernet Solutions" 8 pages, R&M Convincing Cabling Solutions.

Wetzikon, "R&M: The Rising Stars in Copper Cabling" 2 pages, Sep. 1, 2005.

"R&M Star Real 10" 2 pages, Mar. 2006.

"Connections 29" 36 pages, Sep. 2005.

Pfeiler et al., U.S. Pat. No. 7,335,837, issued Feb. 26, 2008.

Disclosure Statement under 1.56.

* cited by examiner

FUSIBLE CONTINUOUS SHIELDS FOR USE IN COMMUNICATION CABLES

TECHNICAL FIELD

Embodiments of the disclosure relate generally to shielding elements for use in communication cables and, more particularly, to continuous shielding elements that contain one or more fusible elements or sections.

BACKGROUND

As the desire for enhanced communication bandwidth escalates, transmission media need to convey information at higher speeds while maintaining signal fidelity and avoiding crosstalk, including alien crosstalk. However, effects such as noise, interference, crosstalk, alien crosstalk, and/or alien equal-level far-end crosstalk ("ELFEXT") can strengthen with increased data rates, thereby degrading signal quality or integrity. For example, when two cables are disposed adjacent to one another, data transmission in one cable can induce signal problems in the other cable via crosstalk interference.

One approach to addressing crosstalk between communication cables is to circumferentially encase one or more conductors in a continuous shield, such as a flexible metallic tube or a foil that coaxially surrounds the cable's conductors. However, complications can arise when a shield is electrically continuous between the two ends of the cable. The continuous shield can inadvertently carry voltage and current along the cable, for example from one terminal device at one end of the cable towards another terminal device at the other end of the cable. Signals carried along the shield can damage equipment connected to a cable and, in some cases, may pose a shock hazard. Loop currents that develop on the shields can also interfere with signals transmitted by the cable. Accordingly, there is an opportunity for improved continuous shields that include fusible elements that break down in the event that a sufficient current is present on the shield.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items; however, various embodiments may utilize elements and/or components other than those illustrated in the figures. Additionally, the drawings are provided to illustrate example embodiments described herein and are not intended to limit the scope of the disclosure.

DETAILED DESCRIPTION

Figure 1:
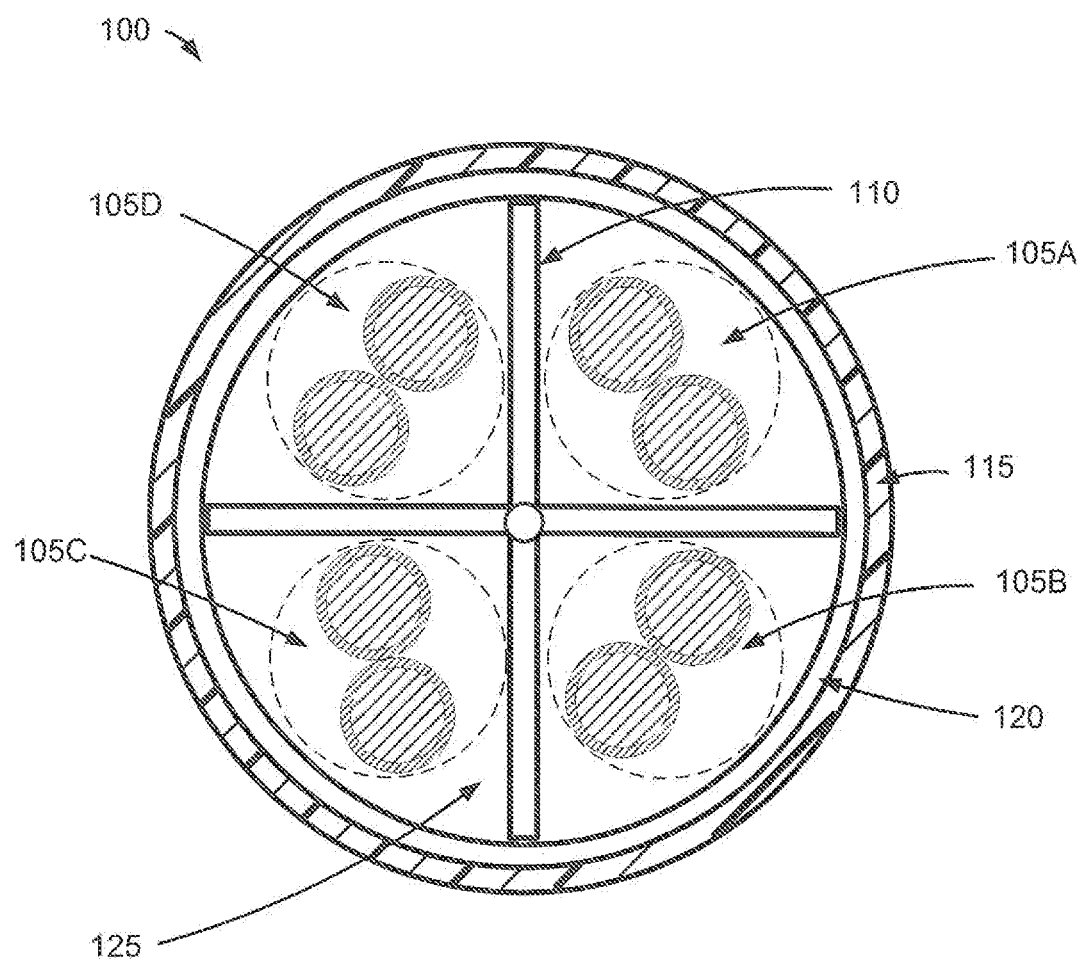
FIGS. 1-3 are cross-sectional views of example cables that each include at least one shielding element formed with one or more fusible elements, according to an illustrative embodiment of the disclosure.

Various embodiments of the present disclosure are directed to shields for use in cables, such as twisted pair communication cables and/or other cables that incorporate electrical conductors. A cable may include one or more transmission media within a core of the cable, such as one or more twisted pairs of conductors. Additionally, one or more suitable shielding elements may be incorporated into the cable in order to provide electromagnetic shielding for one or more of the transmission media. For example, individual twisted pair shields, shields for groups of twisted pairs, overall shields, and/or shielding separators or fillers may be incorporated into the cable. According to an aspect of the disclosure, at least one shielding element may be a continuous shielding element that includes at least one fusible element.

In certain embodiments, a shielding element may include a base layer of dielectric material that extends along a longitudinal direction. A plurality of longitudinally spaced segments of electrically conductive material may be formed on the base layer. Additionally, at least one fusible element may be positioned between each adjacent set of longitudinally spaced segments. The fusible element(s) may provide electrical continuity between the longitudinally spaced segments of electrically conductive material, thereby resulting in the shielding element being electrically continuous along its longitudinal length. In certain embodiments, the longitudinally spaced segments may be discontinuous segments in the absence of the fusible element(s). Additionally, one or more of the fusible elements may be configured to fuse or break down in the event that a fusing current is applied to the shielding element. Once a fusible element has fused, the electrical continuity between the two longitudinally spaced segments connected by the fusible element may be severed. As a result, the two longitudinally spaced segments may be discontinuous, thereby preventing a current or voltage signal from propagating along the longitudinal length of the shielding element between the two segments.

A fusible element may be formed from a wide variety of suitable materials and with a wide variety of suitable dimensions. In certain embodiments, a fusible element and the longitudinally spaced segments connected by the fusible element may be formed from the same electrically conductive material. In other embodiments, the longitudinally spaced segments may be formed from a first electrically conductive material while the fusible element is formed from a second electrically conductive material. Additionally, a fusible element may be formed with a wide variety of suitable lengths, widths, thicknesses, cross-sectional areas, and/or other dimensions. The fusible element may also be configured to fuse or break down based upon a wide variety of current and/or other signals being present on, transmitted through, or introduced to the fusible element. For example, the fusible element may have a minimum fusing current between approximately 0.001 and approximately 0.500 amperes. Additionally, a fusible element may be configured to fuse or break down within a wide variety of suitable time frames. For example, a fusible element may have a maximum time period to break down or fusing that is equal to 0.434 divided by the minimum fusing current (in amperes) to the power or exponent 1.213. In various embodiments, the fusing or break down of a fusible element may be based at least in part upon the material utilized to form the fusible element, a cross-sectional area of the fusible element, a current present on the fusible element, and/or a period of time for which the current is present.

A wide variety of fusible element configurations may be utilized as desired within a shielding element and/or to provide electrical continuity between longitudinally spaced segments of electrically conductive material. In certain embodiments, at least one of the spaced segments may have a width that tapers as it extends longitudinally along the shielding element, and the fusible element may be formed at the narrowest point of the tapered width. In other embodiments, a gap may be formed between two longitudinally spaced segments, and a fusible element may span across the gap. As desired, a fusible element may extend across the gap in a longitudinal direction (e.g., parallel to the longitudinal direction of the shielding element), in a diagonal direction or at an angle relative to the longitudinal direction, in a direction that includes at least one curve or arc, or in any other suitable direction or combination of directions. In certain embodiments, a fusible element having a longer overall length may be more susceptible to fusing. Additionally, in certain embodiments, a fusible element may be formed on the same dielectric layer or substrate as the spaced segments. In other embodiments, a fusible element may be formed on a separate dielectric layer, and the spaced segments and the fusible element may be sandwiched by the two dielectric layers. In yet other embodiment, a fusible element may be formed as an independent component (e.g., a wire, etc.) that is positioned over the spaced segments.

As a result of incorporating one or more fusible elements into a shielding element, a continuous shield layer may be provided that does not need to be grounded on either end. In the event that a potentially dangerous current or charge is present on the shielding element, one or more fusible elements may break down or fuse, thereby severing the electrical continuity of the shielding element. Accordingly, the fusible elements may limit or prevent damage to equipment connected to a cable incorporated the shielding element. In certain embodiments, use of fusible elements may also reduce or limit shock hazards resulting from potentially dangerous currents present on the shielding element.

Embodiments of the disclosure now will be described more fully hereinafter with reference to the accompanying drawings, in which certain embodiments of the disclosure are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 2:
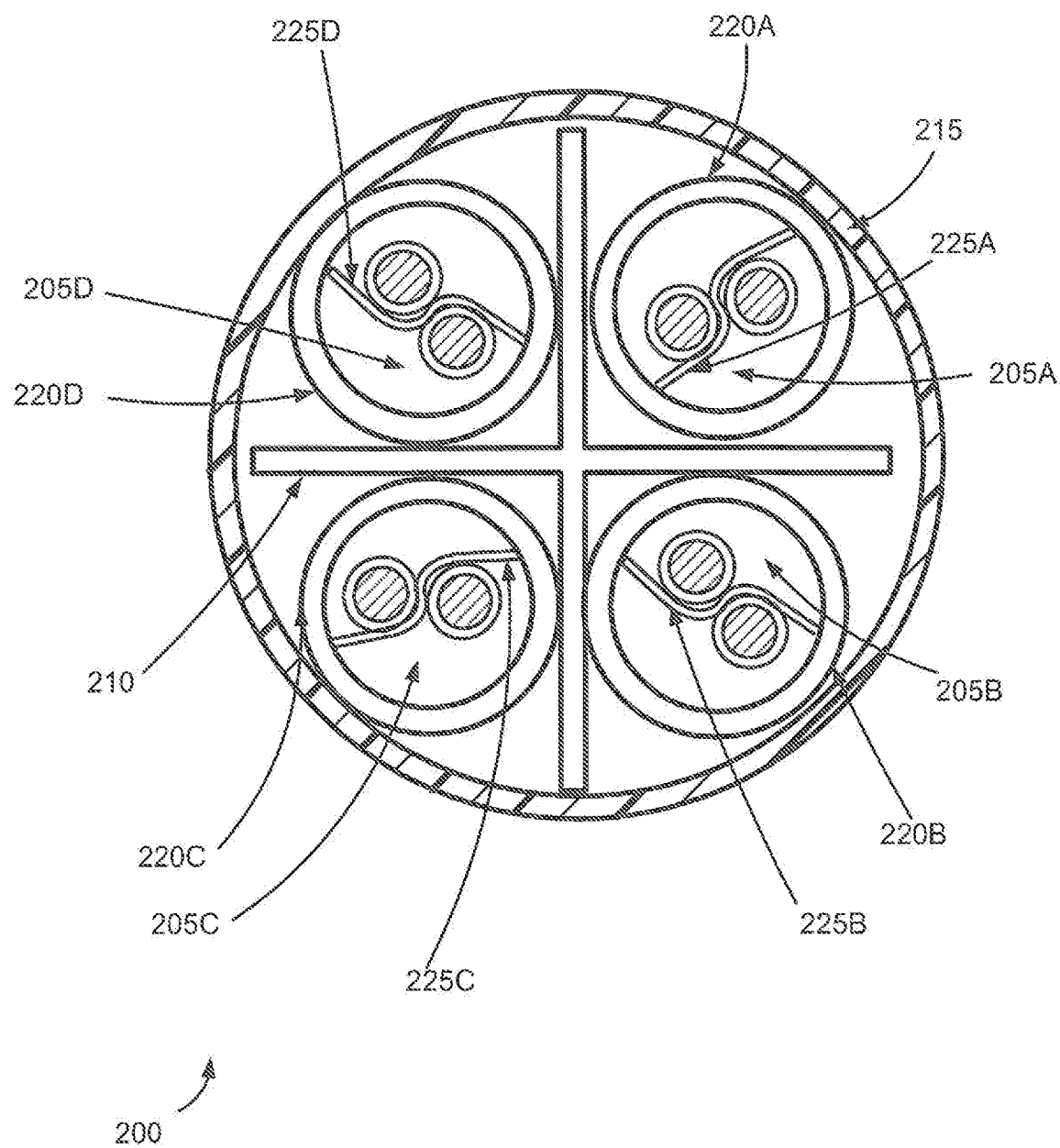
Figure 3:
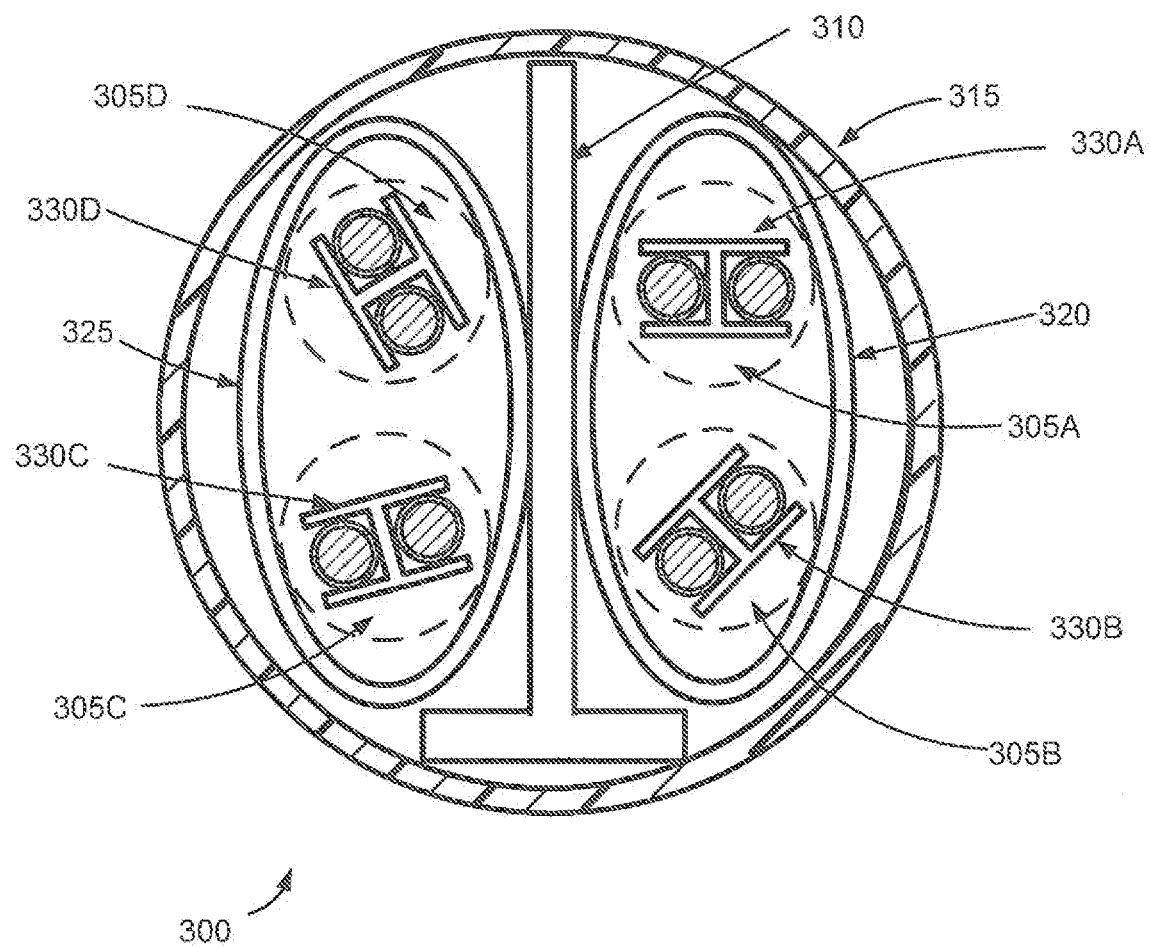

FIGS. 1-3 are cross-sectional views of example cables 100, 200, 300 that each include at least one shielding element or shield formed with one or more fusible elements, according to an illustrative embodiment of the disclosure. Each example cable 100, 200, 300 illustrates a different potential shielding configuration. These shielding configurations are provided by way of non-limiting example only. Other cables may utilize different shielding configurations. Further, any suitable shield or combination of shields may incorporate fusible elements as desired in various embodiments.

With reference to FIG. 1, a cross-section of an example cable 100 that may incorporate at least one shield having one or more fusible elements is illustrated. The cable 100 is illustrated as a communications cable; however, other types of cables may be utilized. The cable 100 may include a wide variety of suitable transmission media, such as one or more twisted pairs, one or more optical fibers, one or more coaxial cables, one or more power conductors, one or more electrical conductors, etc. As illustrated in FIG. 1, the cable 100 may include a plurality of twisted pairs of electrical conductors 105A-D. In other embodiments, the cable 100 may include a combination of twisted pairs and one or more other types of transmission media (e.g., optical fibers, etc.). Additionally, embodiments of the disclosure may be utilized in association with horizontal cables, vertical cables, flexible cables, equipment cords, cross-connect cords, plenum cables, riser cables, or any other appropriate types of cables.

According to an aspect of the disclosure, the cable 100 may also include one or more shielding elements. Shielding elements may include, for example, shield layers wrapped around or enclosing one or more of the twisted pairs 105A-D and/or a separation filler 110 incorporating shielding material and positioned between one or more twisted pairs. As explained in greater detail below, at least one of the shielding elements may include at least one fusible element. For example, a shielding element may include a plurality of longitudinally spaced segments of electrically conductive material, and a respective fusible element may be positioned between each adjacent set or pair of longitudinally spaced segments. Additionally, an outer jacket 115 may be formed around the twisted pairs 105A-D and one or more shielding elements.

In certain embodiments, one or more shield layers can be disposed between the jacket 115 and one or more additional cable components. For example, an external shield 120 or an overall shield may be disposed between the jacket 115 and the twisted pairs 105. As another example, as illustrated in FIG. 2, individual shields may be provided for each of the twisted pairs. As yet another example, as illustrated in FIG. 3, shield layers may be provided for any desired groupings of twisted pairs. In other embodiments, a shield layer (or shielding material) may be incorporated into or embedded into the jacket 115 or placed on the outside of the jacket 115. In yet other embodiments, a combination of different types of shield layers may be incorporated into a cable 100. Indeed, a wide variety of suitable shield layers and/or combinations of shield layers may be utilized. Further, in certain embodiments, the cable 100 may include a separate, armor layer (e.g., a corrugated armor, etc.) for providing mechanical protection.

A shield layer, such as an external shield 120 or an individual twisted pair shield, may be formed from a wide variety of suitable materials and/or utilizing a wide variety of suitable techniques. In certain embodiments, a shield layer may be formed with a plurality of layers. For example, electrically conductive material may be formed on a dielectric substrate to form a shield layer. According to an aspect of the disclosure, the electrically conductive material may be arranged into a plurality of longitudinally spaced segments. Additionally, each adjacent set or pair of segments may be electrically connected to one another by one or more fusible elements. As desired in various embodiments, a fusible element may be formed from the same electrically conductive material as the spaced segments or alternatively from a different electrically conductive material. Additionally, in certain embodiments, a fusible element may be formed on the same dielectric layer or substrate as the spaced segments. In other embodiments, a fusible element may be formed on a separate dielectric layer, and the spaced segments and the fusible element may be sandwiched between the two dielectric layers. In yet other embodiment, a fusible element may be formed as an independent component (e.g., a wire, etc.) that is positioned over the spaced segments. Example shield layer constructions and fusible element configurations are described in greater detail below with reference to 5A-7E.

Any number of twisted pairs may be utilized as desired in the cable 100. As shown in FIG. 1, the cable 100 may include four twisted pairs 105A, 105B, 105C, 105D. Each twisted pair (referred to generally as twisted pair 105) may include two electrical conductors, each covered with respective insulation. The electrical conductors of a twisted pair 105 may be formed from any suitable electrically conductive material, such as copper, aluminum, silver, annealed copper, gold, a conductive alloy, etc. In certain embodiments, one or more electrical conductors may also be coated with another material (e.g., tinned copper, etc.) Additionally, the electrical conductors may have any suitable diameter, gauge, and/or other dimensions. Further, each of the electrical conductors may be formed as either a solid conductor or as a conductor that includes a plurality of conductive strands that are twisted together.

The twisted pair insulation may include any suitable dielectric materials and/or combination of materials. Examples of suitable dielectric materials include, but are not limited to, one or more polymeric materials, one or more polyolefins (e.g., polyethylene, polypropylene, etc.), one or more fluoropolymers (e.g., fluorinated ethylene propylene ("FEP"), melt processable fluoropolymers, MFA, PFA, ethylene tetrafluoroethylene ("ETFE"), ethylene chlorotrifluoroethylene ("ECTFE"), etc.), one or more polyesters, polyvinyl chloride ("PVC"), one or more flame retardant olefins, a low smoke zero halogen ("LSZH") material, etc.), nylon, polyurethane, neoprene, cholorosulphonated polyethylene, flame retardant PVC, low temperature oil resistant PVC, flame retardant polyurethane, flexible PVC, or a combination of any of the above materials. Additionally, in certain embodiments, the insulation of each of the electrical conductors utilized in the twisted pairs 105A-D may be formed from similar materials. For example, in a plenum cable, each of the twisted pairs 105A-D may include FEP insulation. In other embodiments, at least two of the twisted pairs may utilize different insulation materials. In yet other embodiments, the two conductors that make up a twisted pair 105 may utilize different insulation materials. As desired in certain embodiments, insulation may additionally include a wide variety of other materials (e.g., filler materials, materials compounded or mixed with a base insulation material, etc.), such as smoke suppressant materials, flame retardant materials, etc.

In various embodiments, twisted pair insulation may be formed from one or multiple layers of insulation material. A layer of insulation may be formed as solid insulation, unfoamed insulation, foamed insulation, or other suitable insulation. As desired, combinations of different types of insulation may be utilized. For example, a foamed insulation layer may be covered with a solid foam skin layer. As desired with foamed insulation, different foaming levels may be utilized for different twisted pairs in accordance with twist lay length to assist in balancing propagation delays between the twisted pairs. Additionally, the insulation may be formed with any suitable thickness, inner diameter, outer diameter, and/or other dimensions.

Each twisted pair 105 can carry data or some other form of information, for example in a range of about one to ten Giga bits per second ("Gbps") or other suitable data rates, whether higher or lower. In certain embodiments, each twisted pair 105 supports data transmission of about two and one-half Gbps (e.g. nominally two and one-half Gbps), with the cable 100 supporting about ten Gbps (e.g. nominally ten Gbps). In certain embodiments, each twisted pair 105 supports data transmission of up to about ten Gbps (e.g. nominally ten Gbps), with the cable 100 supporting about forty Gbps (e.g. nominally forty Gbps).

Each twisted pair 105 may also be formed with any suitable twist lay. In certain embodiments, each of the twisted pairs 105A-D may be formed with similar or approximately equal twist lays. In other embodiments, a desired number of the twisted pairs 105A-D may be formed with different respective twist lays. For example, each of the twisted pairs 105A-D may have a different twist lay. The different twist lays may function to reduce crosstalk between the twisted pairs, and a wide variety of suitable twist lay configurations may be utilized. In certain embodiments, the respective twist lays for the twisted pairs 105A-D may be selected, calculated, or determined in order to result in a cable 100 that satisfies one or more standards and/or electrical requirements. For example, twist lays may be selected such that the cable 100 satisfies one or more electrical requirements of a Category 5, Category 5e, Category 6, Category 6A, or other suitable standard. Twist lays may be selected in order to satisfy a wide variety of other electrical requirements as desired in various embodiments.

In certain embodiments, the differences between twist lays of twisted pairs that are circumferentially adjacent one another (for example the twisted pair 105A and the twisted pair 105B) may be greater than the differences between twist lays of twisted pairs that are diagonal from one another (for example the twisted pair 105A and the twisted pair 105C). As a result of having similar twist lays, the twisted pairs that are diagonally disposed can be more susceptible to crosstalk issues than the twisted pairs that are circumferentially adjacent; however, the additional distance between the diagonally disposed pairs may limit the crosstalk. Thus, the different twist lays and arrangements of the pairs can help reduce crosstalk among the twisted pairs 105A-D. As desired, the plurality of twisted pairs 105A-D may be twisted together with an overall twist or bunch. Any suitable overall twist lay or bunch lay may be utilized. Further, in certain embodiments, each of the twisted pairs 105A-D may be twisted in the same direction (e.g., clockwise, counter clockwise, etc.). In other embodiments, at least two of the twisted pairs 105A-D may be twisted in opposite directions. Additionally, a overall twist may be formed in any suitable direction. Indeed, a wide variety of suitable twist lays and twist directions may be utilized as desired in various embodiments.

As desired in certain embodiments, one or more suitable bindings or wraps may be wrapped or otherwise formed around the twisted pairs 105A-D once they are twisted together. Additionally, in certain embodiments, multiple grouping of twisted pairs may be incorporated into a cable. As desired, each grouping may be twisted, bundled, and/or bound together. Further, in certain embodiments, the multiple groupings may be twisted, bundled, or bound together.

The jacket 115 may enclose the internal components of the cable 100, seal the cable 100 from the environment, and provide strength and structural support. The jacket 115 may be formed from a wide variety of suitable materials and/or combinations of materials, such as such as one or more polymeric materials, one or more polyolefins (e.g., polyethylene, polypropylene, etc.), one or more fluoropolymers (e.g., fluorinated ethylene propylene ("FEP"), melt processable fluoropolymers, MFA, PFA, ethylene tetrafluoroethylene ("ETFE"), ethylene chlorotrifluoroethylene ("ECTFE"), etc.), one or more polyesters, polyvinyl chloride ("PVC"), one or more flame retardant olefins (e.g., flame retardant polyethylene ("FRPE"), flame retardant polypropylene ("FRPP"), a low smoke zero halogen ("LSZH") material, etc.), polyurethane, neoprene, cholorosulphonated polyethylene, flame retardant PVC, low temperature oil resistant PVC, flame retardant polyurethane, flexible PVC, or a combination of any of the above materials. The jacket 115 may be formed as a single layer or, alternatively, as multiple layers. In certain embodiments, the jacket 115 may be formed from one or more layers of foamed material. As desired, the jacket 115 can include flame retardant and/or smoke suppressant materials. Additionally, the jacket 115 may include a wide variety of suitable shapes and/or dimensions. For example, the jacket 115 may be formed to result in a round cable or a cable having an approximately circular cross-section; however, the jacket 115 and internal components may be formed to result in other desired shapes, such as an elliptical, oval, or rectangular shape. The jacket 115 may also have a wide variety of dimensions, such as any suitable or desirable outer diameter and/or any suitable or desirable wall thickness. In various embodiments, the jacket 115 can be characterized as an outer jacket, an outer sheath, a casing, a circumferential cover, or a shell.

An opening enclosed by the jacket 115 may be referred to as a cable core, and the twisted pairs 105A-D may be disposed within the cable core. Although a single cable core is illustrated in the cable 100 of FIG. 1, a cable may be formed to include multiple cable cores. In certain embodiments, the cable core may be filled with a gas such as air (as illustrated) or alternatively a gelatinous, solid, powder, moisture absorbing material, water-swellable substance, dry filling compound, or foam material, for example in interstitial spaces between the twisted pairs 105A-D. Other elements can be added to the cable core as desired, for example one or more optical fibers, additional electrical conductors, additional twisted pairs, water absorbing materials, and/or strength members, depending upon application goals.

In certain embodiments, the cable 100 may also include a separator 110 or filler configured to orient and or position one or more of the twisted pairs 105A-D. The orientation of the twisted pairs 105A-D relative to one another may provide beneficial signal performance. As desired in various embodiments, the separator 110 may be formed in accordance with a wide variety of suitable dimensions, shapes, or designs. For example, a rod-shaped separator, a flat tape separator, a flat separator, an X-shaped or cross-shaped separator, a T-shaped separator, a Y-shaped separator, a J-shaped separator, an L-shaped separator, a diamond-shaped separator, a separator having any number of spokes extending from a central point, a separator having walls or channels with varying thicknesses, a separator having T-shaped members extending from a central point or center member, a separator including any number of suitable fins, and/or a wide variety of other shapes may be utilized. In certain embodiments, material may be extruded, cast, or molded into a desired shape to form the separator 110. In other embodiments, a tape may be formed into a desired shape utilizing a wide variety of folding and/or shaping techniques. For example, a relatively flat tape separator may be formed into an X-shape or cross-shape as a result of being passed through one or more dies.

In certain embodiments, the separator 110 may be continuous along a length of the cable 100. In other embodiments, the separator 110 may be non-continuous or discontinuous along a length of the cable 100. In other words, the separator 110 may be separated, segmented, or severed in a longitudinal direction such that discrete sections or portions of the separator 110 are arranged longitudinally (e.g., end to end) along a length of the cable 100. Use of a non-continuous or segmented separator may enhance the flexibility of the cable 100, reduce an amount of material incorporated into the cable 100, and/or reduce the cable cost.

The separator 110 may be formed from a wide variety of suitable materials as desired in various embodiments. For example, the separator 110 and/or various separator segments can include paper, metals, alloys, various plastics, one or more polymeric materials, one or more polyolefins (e.g., polyethylene, polypropylene, etc.), one or more fluoropolymers (e.g., fluorinated ethylene propylene ("FEP"), melt processable fluoropolymers, MFA, PFA, ethylene tetrafluoroethylene ("ETFE"), ethylene chlorotrifluoroethylene ("ECTFE"), etc.), one or more polyesters, polyvinyl chloride ("PVC"), one or more flame retardant olefins (e.g., flame retardant polyethylene ("FRPE"), flame retardant polypropylene ("FRPP"), a low smoke zero halogen ("LSZH") material, etc.), polyurethane, neoprene, cholorosulphonated polyethylene, flame retardant PVC, low temperature oil resistant PVC, flame retardant polyurethane, flexible PVC, or any other suitable material or combination of materials. As desired, the separator 110 may be filled, unfilled, foamed, un-foamed, homogeneous, or inhomogeneous and may or may not include additives (e.g., flame retardant and/or smoke suppressant materials).

In certain embodiments, electrically conductive material may be incorporated into a separator 110. For example, a separator 110 may include electrically conductive material formed on or adhered to a dielectric substrate or base (e.g., a tape that is folded into a desired separator shape, an extruded dielectric base, etc.). As another example, a separator 110 may include electrically conductive material embedded into a dielectric material or sandwiched between two dielectric layers. As a result of incorporating electrically conductive material, the separator 110 may function as a shielding element. Additionally, in certain embodiments and as described in greater detail below, electrically conductive material incorporated into a separator 110 may include a plurality of longitudinally spaced segments of electrically conductive material. One or more fusible elements may be utilized to electrically connect adjacent sets or pairs of the longitudinally spaced segments of electrically conductive material.

As set forth above, a wide variety of different types of shielding elements (e.g., shield layers, separators that include shielding material, etc.) and/or combinations of shielding elements may be incorporated into a cable 100. These shielding elements may utilize a wide variety of different materials and/or have a wide variety of suitable configurations. For example, a wide variety of suitable electrically conductive materials or combinations of materials may be utilized in a shielding element including, but not limited to, metallic material (e.g., silver, copper, annealed copper, gold, aluminum, etc.), metallic alloys, conductive composite materials, etc. Indeed, suitable electrically conductive materials may include any material having an electrical resistivity of less than approximately $1 \times 10^{-7}$ ohm meters at approximately 20° C., such as an electrical resistivity of less than approximately $3 \times 10^{-8}$ ohm meters at approximately 20° C. According to an aspect of the disclosure, at least one shielding element may include a plurality of longitudinally spaced segment of electrically conductive material. Each segment may have any desired dimensions, such as any desired lengths, widths, and/or thicknesses. Further, one or more fusible elements may span between each set of longitudinally adjacent segments. Each fusible element may have a wide variety of suitable lengths, widths, thicknesses, cross-sectional areas and/or other dimensions. In certain embodiments, a fusible element may be formed from the same material as the segments of electrically conductive material. In other embodiments, a fusible element may be formed from a different electrically conductive material.

A wide variety of suitable techniques and/or processes may be utilized to form a shielding element. For example, a separator 110 may be formed by extruding, poltruding, or otherwise forming a base dielectric layer, and electrically conductive material may then be applied or adhered to the base material. As desired, a base layer in a separator 110 may have a substantially uniform composition and/or may be made of a wide range of materials. Additionally, the base layer may be fabricated in any number of manufacturing passes, such as a single manufacturing pass. Further, the base layer may be foamed, may be a composite, and/or may include one or more strength members, fibers, threads, or yarns. As desired, flame retardant material, smoke suppressants, and/or other desired substances may be blended or incorporated into the base layer. Additionally, as desired, the base layer may be hollow to provide a cavity that may be filled with air or some other gas, gel, fluid, moisture absorbent, water-swellable substance, dry filling compound, powder, one or more optical fibers, one or more metallic conductor (e.g., a drain wire, etc.), shielding, or some other appropriate material or element. In certain embodiments, a fusible element may also be formed on the base dielectric layer of the separator 110. In other embodiments, a fusible element may be positioned adjacent to the base dielectric layer and segments of electrically conductive material. For example, a fusible element may be formed on a second dielectric layer or as a separate element that is positioned adjacent to the base components of the separator 110.

In certain embodiments, a shielding element, such as a shield layer (e.g., an external shield layer 120, an individual twisted pair shield, etc.) or separator 110, may be formed as a tape that includes both a dielectric layer (e.g., plastic, polyester, polyethylene, polypropylene, fluorinated ethylene propylene, polytetrafluoroethylene, polyimide, or some other polymer or dielectric material that does not ordinarily conduct electricity, etc.) and electrically conductive material (e.g., copper, aluminum, silver, an alloy, etc.) formed on or otherwise attached (e.g., adhered, etc.) to the dielectric layer. For example, longitudinally spaced segments of electrically conductive material and, in certain embodiments, one or more fusible elements, may be formed on or attached to the dielectric layer. In the event that an adhesive is utilized to join a dielectric layer and electrically conductive material, a wide variety of suitable adhesives can be used. In other embodiments, electrically conductive material may be formed on a dielectric layer via any number of suitable techniques, such as the application of metallic ink or paint, liquid metal deposition, vapor deposition, welding, heat fusion, adherence of patches to the dielectric, etc. In certain embodiments, a dielectric layer and electrically conductive may be over-coated with a second dielectric layer. For example, a separate or second dielectric layer may be formed over a first dielectric layer on which longitudinally spaced segments of electrically conductive material and fusible elements are formed. As another example, electrically conductive material utilized to form fusible elements may be formed on a second dielectric layer, and the second dielectric layer may be positioned over the first dielectric layer and longitudinally spaced segments. In either case, the spaced segments and fusible elements may be sandwiched between two dielectric layers. Indeed, any number of suitable layers of material may be utilized to form a tape which may be used as a shielding element.

A base dielectric layer incorporated into a shielding element may be formed from a wide variety of suitable materials and/or combinations of materials. Examples of suitable materials include, but are not limited to, paper, various plastics, one or more polymeric materials, one or more polyolefins (e.g., polyethylene, polypropylene, etc.), one or more fluoropolymers (e.g., fluorinated ethylene propylene ("FEP"), melt processable fluoropolymers. MFA. PFA, polytetrafluoroethylene, ethylene tetrafluoroethylene ("ETFE"), ethylene chlorotrifluoroethylene ("ECTFE"), etc.), one or more polyesters, polyimide, polyvinyl chloride ("PVC"), one or more flame retardant olefins (e.g., flame retardant polyethylene ("FRPE"), flame retardant polypropylene ("FRPP"), a low smoke zero halogen ("LSZH") material, etc.), polyurethane, neoprene, cholorosulphonated polyethylene, flame retardant PVC, low temperature oil resistant PVC, flame retardant polyurethane, flexible PVC, or any other suitable material or combination of materials. As desired, one or more foamed materials may be utilized to form a base dielectric layer. Indeed, a base dielectric layer may be filled, unfilled, foamed, un-foamed, homogeneous, or inhomogeneous and may or may not include one or more additives (e.g., flame retardant and/or smoke suppressant materials).

The base dielectric layer may also be formed with a wide variety of suitable dimensions. For example, the base dielectric layer may have any suitable width. In certain embodiments, the width may be determined based at least in part upon a desired cable component (e.g., a shield, a separator, etc.) to be formed from a shielding element. In other embodiments, the width may be determined based at least in part upon a desired number of twisted pairs and/or other components to be encompassed by a shielding element. In certain example embodiments, the base dielectric layer may have a width W between approximately five (5) mm and approximately thirty (30) mm. For example, the base dielectric layer may have a width of approximately 5, 10, 15, 20, 25, or 30 mm, a width included in a range between two of the above values, or a width included in a range that is bounded at either a minimum or maximum end by one of the above values. Additionally, the base dielectric layer may be formed with any suitable thickness. For example, a base dielectric layer may have a thickness of about 0.025 mm (about 1 mil or thousandths of an inch) to about 0.12 mm (about 5 mils) or a thickness of about 10 to about 125 microns.

According to an aspect of the disclosure, at least one shielding element may include a plurality of longitudinally spaced segments of electrically conductive material. Additionally, adjacent sets or pairs of the plurality of longitudinally spaced segments may be electrically connected to one another by one or more suitable fusible elements. In certain embodiments, segments of electrically conductive material may be formed on a base dielectric layer, such as a dielectric layer of a tape or an extruded or otherwise formed base layer of a separator. Any suitable number of longitudinally spaced segments of electrically conductive material may be incorporated into a shielding element. Further, each segment may include a wide variety of suitable dimensions, for example, any suitable lengths in the longitudinal direction, any suitable width across the base dielectric layer, and/or any suitable thicknesses. In certain embodiments, the longitudinally spaced segments may be formed in accordance with a pattern having a repeating step. For example, the segments may have lengths and/or spacings between segments that are arranged in a pattern. In other embodiments, the longitudinally spaced segments may be formed or arranged in a random or pseudo-random manner. As desired, the dimensions of the segments can be selected to provide electromagnetic shielding over a specific band of electromagnetic frequencies or above or below a designated frequency threshold.

Each of the longitudinally spaced segments of electrically conductive material may be formed with any suitable length. In certain embodiments, each of the segments may have equal or approximately equal lengths. In other embodiments, at least two segments may have different longitudinal lengths. In certain embodiments, each segment may have a length of about half a meter to about ten meters or greater, although smaller lengths (e.g., lengths of about 0.03 to about 0.05 m, etc.) may be utilized. In various embodiments, the segments may have longitudinal lengths of about 0.03, 0.05, 0.1, 0.3, 0.5, 0.75, 1.0, 1.5, 2.0, 2.5, 3.0, 3.5, 4.0, 4.5, or 5.0 meters or in a range between any two of these values. Additionally, each of the longitudinally spaced segments may have any suitable width. In certain embodiments, each segment may have equal or approximately equal widths. In other embodiments, at least two segments may have different widths. Further, in certain embodiments, one or more segments may have widths that span across or approximately across (e.g., with a narrow space of dielectric material present on one or both sides) the width of an underlying base layer. In other words, the longitudinally spaced segments may span across or substantially across the base layer in a widthwise direction or dimension perpendicular to the longitudinal direction. In other embodiments, one or more segments may have widths that are substantially smaller than that of the underlying base dielectric layer. For example, a shielding element may be formed with two or more parallel rows of longitudinally spaced segments, and the two or more rows may be spaced along a widthwise dimension of the base dielectric layer. Each of the one or more rows of longitudinally spaced segments may include respective fusible elements.

Additionally, the longitudinally spaced segments may include electrically conductive material having any desired thickness, such as a thickness of about 13 microns (0.5 mils) or greater. In many applications, signal performance of a cable 100 may benefit from a thickness that is greater than about 50 microns, for example in a range of about 50 to about 65 microns, about 50 to about 57 microns, about 57 to about 65 microns, about 65 to about 76 microns, or about 50 to about 76 microns. Indeed, with a thickness of less than about 38 microns (1.5 mils), negative insertion loss characteristics may be present on the cable 100. A wide variety of other configurations including different thicknesses will also be appreciated.

Figure 6A:
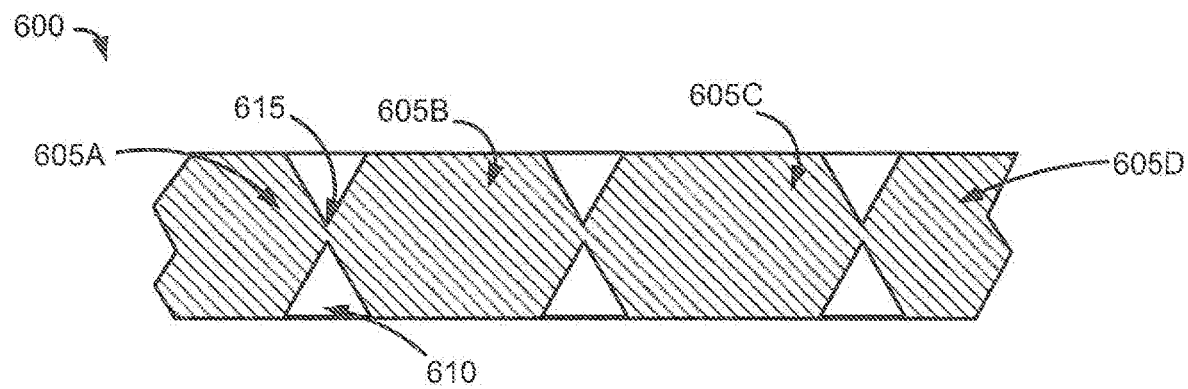
FIGS. 6A-6L illustrate example configurations of fusible elements that may be utilized in association with shielding elements in various embodiments of the disclosure.
Figure 6B:
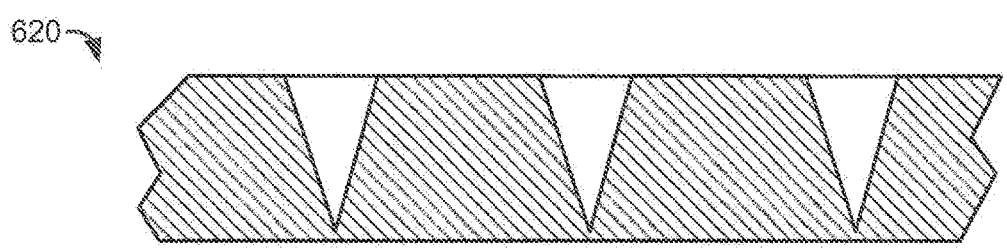
Figure 6C:
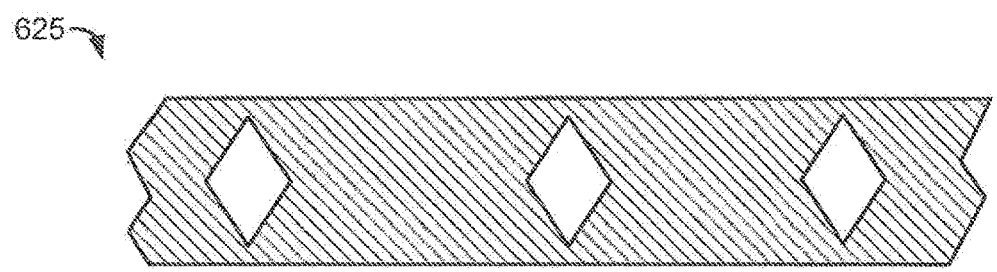
Figure 6D:
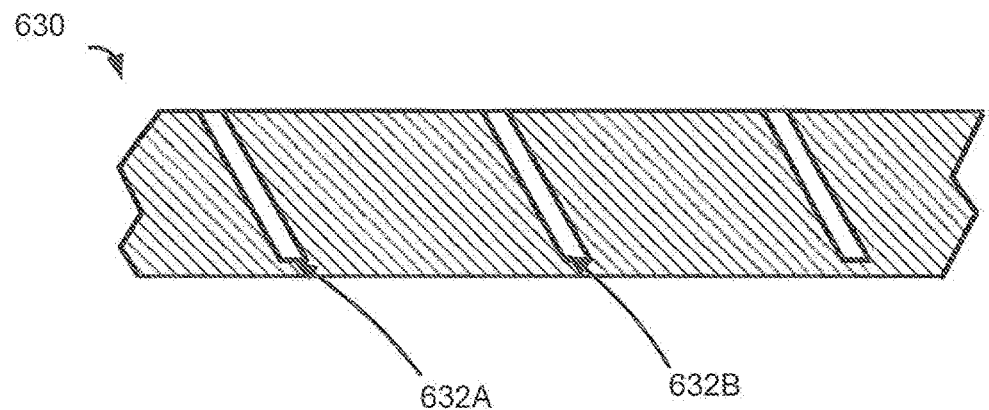

Additionally, the longitudinally spaced segments may be formed with any suitable shapes as desired in various embodiments. In certain embodiments, gaps or spaces may be formed between adjacent segments, and one or more fusible elements may span each gap. For example, the spaced segments may be formed with rectangular shapes extending in a longitudinal direction, and one or more fusible elements may span gaps between adjacent rectangular segments. FIGS. 6E-6L illustrate example shielding elements in which spaced segments are formed with rectangular shapes. As another example, spaced segments may be formed with parallelogram shapes (i.e., shapes with angled edges, etc.), and one or more fusible elements may span gaps between adjacent segments. FIG. 6D illustrates an example shielding element in which spaced segments are formed with parallelogram shapes. When a shield layer is wrapped around one or more twisted pairs, the parallelogram shapes may result in the spaced segments having a spiral direction around the twisted pairs. In certain embodiments, the segments may have a spiral direction opposite the twist direction of the pairs 105A-D. For example, the cable core and the four twisted pairs 105A-D may be collectively twisted about a longitudinal axis of the cable 100 in a common direction. For example, if the cable lay direction opposes the direction of the segment spiral, an enhanced level of shielding performance may be provided. In other embodiments, the segments may have a spiral direction that is the same as the twist direction of the pairs 105A-D.

In other embodiments, one or more spaced segments may be formed with portions that taper along a longitudinal direction. For example, a spaced segment included in a pair of longitudinally adjacent segments may have a width that tapers or narrows along a longitudinal direction as it approaches the adjacent segment. In certain embodiments, a single spaced segment included in a pair of adjacent segments may taper or narrow. In other embodiments, both of the spaced segments included in a pair may taper or narrow as they approach one another. Additionally, in certain embodiment, a first segment may extend towards an adjacent second segment with a single tapering portion or section. FIGS. 6A and 6B illustrate example shield segments in which longitudinally adjacent segments include single tapering portions. In other embodiments, a first segment may extend towards an adjacent second segment with two or more tapering portions or sections. FIG. 6C illustrates an example shield segment in which longitudinally adjacent segments include multiple tapering portions. According to an aspect of the disclosure, a fusible element may be positioned at or proximate to the narrowest point of a tapered portion or section. In other words, the width of a spaced segment may narrow or taper to a narrowest widthwise point. The fusible element may then be either formed at the narrowest point or may extend towards an adjacent segment from the narrowest point.

As set forth above, one or more respective fusible elements may span between or provide electrical continuity between each set of longitudinally adjacent spaced sections of electrically conductive material. A fusible element may be configured to fuse or break down in the event that a threshold current is present on, transmitted through, or introduced to the fusible element. Once the one or more fusible elements spanning between a set of adjacent spaced segments have fused or broken down, the electrical continuity between the segments may be severed, thereby prevent an electrical current from propagating longitudinally along the shielding element. As a result, the fusible elements may function as a safety mechanism for equipment connected to the cable 100 and/or may reduce or limit the shock hazard of the shielding element.

A fusible element may be formed or designed to have a wide variety of suitable minimum fusing currents. In certain embodiments, a fusible element may have a minimum fusing current between approximately 0.001 and approximately 0.500 amperes. In various embodiments, a fusible element may have a minimum fusing current of 0.001, 0.005, 0.010, 0.020, 0.030, 0.040, 0.050, 0.075, 0.10, 0.125, 0.15, 0.175, 0.20, 0.25, 0.30, 0.35, 0.40, 0.45, or 0.50 amperes, or a minimum fusing current included in a range between any two of the above values. Additionally, a fusible element may be configured to fuse or break down within a wide variety of suitable time frames. For example, a fusible element may have a maximum time period to break down or fusing defined by equation one (1) below:

$$T_F = 0.0434/(C_F^{1.213}) \quad (1)$$

where $T_F$ is the maximum time period until fusing or break down and CF is the minimum fusing current.

In various embodiments, the fusing or break down of a fusible element may be based at least in part upon several different factors including, but not limited to, the material(s) utilized to form the fusible element, a cross-sectional area of the fusible element, a current present on the fusible element, and/or a period of time for which the current is present. As desired, one or more materials utilized to form a fusible element and one or more dimensions of the fusible element (e.g., a width, a thickness, a cross-sectional area, etc.) may be selected in order to attain a desired minimum fusing current and/or maximum time until fusing.

A fusible element may be formed from a wide variety of suitable materials and/or combinations of materials. Examples of suitable materials that may be utilized to form a fusible element include, but are not limited to, metallic material (e.g., silver, copper, annealed copper, gold, aluminum, etc.), metallic alloys, conductive composite materials, etc. Indeed, suitable electrically conductive materials may include any material having an electrical resistivity of less than approximately $1 \times 10^{-7}$ ohm meters at approximately 20° C., such as an electrical resistivity of less than approximately $3 \times 10^{-8}$ ohm meters at approximately 20° C. In certain embodiments, a fusible element and the longitudinally spaced segments connected by the fusible element may be formed from the same electrically conductive material. In other embodiments, the longitudinally spaced segments may be formed from a first electrically conductive material while the fusible element is formed from a second electrically conductive material.

In certain embodiments, a fusible element may be formed across or span across a longitudinal gap, spacing, or distance between two adjacent spaced segments of electrically conductive material. The fusible element may span across any suitable longitudinal gap as desired in various embodiments. For example, a fusible element may span across a longitudinal gap of approximately 0.01, 0.05, 0.1, 0.15, 0.2, 0.25, 0.3, 0.4, 0.5, 1.0, 1.5, 2.0, 2.5, 3.0, 3.5, 3.5, 4.0, 4.5, 5.0, 6.0, 7.0, 8.0, 9.0, 10, 12, 15, or 20 millimeters, a longitudinal gap or length included in a range between any two of the above values, or a longitudinal gap or length included in a range bounded on either a minimum or maximum end by one of the above values. In certain embodiments, a fusible element may span across a longitudinal gap that is large enough to prevent current from arcing across the gap once the fusible element has fused or broken down. Further, as explained in greater detail below, a fusible element may extend across a longitudinal gap or spacing in a wide variety of directions and/or combinations of directions.

Additionally, a fusible element may be formed with a wide variety of suitable dimensions, such as any suitable lengths, widths, thicknesses, cross-sectional areas, and/or other dimensions. In certain embodiments, a length of a fusible element may correspond to or incorporate the sections of one or more tapered portions of spaced segment that will fuse with a desired minimum fusing current. For example, one or both spaced segments included in an adjacent pair of spaced segments may taper as they approach one another. The tapering may result in progressively less electrically conductive material. The fusible element may begin at a point in which the electrically conductive material becomes small enough to fuse with a desired minimum fusing current. Accordingly, in certain embodiments, the fusible element may be formed as part of one or more spaced segments. For example, the fusible element may be formed at or proximate to a narrowest point of one or more tapering portions of spaced segments. In other embodiments, a fusible element may extend from the end of a narrowest point of a tapered portion of a spaced segment towards an adjacent spaced segment.

In other embodiments, a length of a fusible element may be approximately equal to the longitudinal gap or spacing formed between two adjacent spaced segments. For example, a fusible element may extend across a gap in a longitudinal direction between two adjacent spaced segments. In yet other embodiments, a length of a fusible element may be greater than the longitudinal length of a gap or spacing formed between two adjacent spaced elements. For example, a fusible element may extend across a gap at an angle relative to the longitudinal direction, in a direction that includes one or more curves or arcuate portions, or in a fashion that includes one or more changes of directions. In certain embodiments, a longer length of a fusible element may increase the likelihood of the fusible element fusing in the event that a fusing current is applied. A longer length results in the current propagating over a longer distance, thereby enhancing likelihood of fusing or break down.

A fusible element may also be formed with any suitable width, thickness, and/or cross-sectional area. As set forth above, the minimum fusing current for a fusible element may be based at least in part on the cross-sectional area of the fusible element. The cross-sectional area of the fusible current may be based at least in part upon a width, thickness, diameter, and/or other dimensions of the fusible element. As desired, one or more dimensions of a fusible element may be selected in order to result in fusible element having a desired minimum fusing current. Further, the one or more dimensions of the fusible element may also be based at least in part upon the material utilized to form the fusible element. In certain embodiments, a fusible element may have a constant width, thickness, and/or cross-sectional area across its length. In other embodiments, a fusible element may have a width, thickness, and/or a cross-sectional area that is varied across its length. For example, a fusible element that is formed from parts of one or more tapering or narrowing portions of spaced segment may have a width that varies across its length (e.g., a width that narrows with a tapering section of a first segment and then widens with a tapering section of an adjacent second segment, etc.).

In certain embodiments, a fusible element may have a thickness that is approximately equal to the thickness of the longitudinal spaced segments of electrically conductive material. For example, the fusible element may have thickness that is approximately equal to any of the example thicknesses discussed above with reference to the spaced segments. In other embodiments, a fusible element may have a thickness that is less than that of the longitudinally spaced segments joined by the fusible element. The cross-sectional area of the fusible element may be reduced as a result of the smaller thickness, thereby enhancing the fusibility of the fusible element. Additionally, in certain embodiments, the fusible element may have a relatively constant thickness along its length. In other embodiments, a thickness of the fusible element may vary along its length.

A wide variety of suitable fusible element configurations may be utilized as desired within a shielding element and/or to provide electrical continuity between longitudinally spaced segments of electrically conductive material. In certain embodiments, at least one of the spaced segments may have a width that tapers as it extends longitudinally along the shielding element, and the fusible element may be formed at the narrowest point of the tapered width. A few example fusible elements formed within or proximate to one or more tapered portions are described in greater detail below with reference to FIGS. 6A-6C. In other embodiments, a gap may be formed between two longitudinally spaced segments, and a fusible element may span across the gap. As desired, a fusible element may extend across the gap in a longitudinal direction (e.g., parallel to the longitudinal direction of the shielding element), in a diagonal direction or at an angle relative to the longitudinal direction, in a direction that includes at least one curve or arc, or in any other suitable direction or combination of directions. A few example fusible elements that extend across gaps are described in greater detail below with reference to FIGS. 6D-6L. Additionally, as set forth above, a fusible element having a longer overall length may be more susceptible to fusing. Further, any suitable number of fusible elements may be utilized to provide electrical connectivity between two adjacent spaced segments. For example, one, two, or another desirable number of fusible elements may be utilized. As the number of fusible elements increased, the minimum fusing current may also increase.

Additionally, in certain embodiments, a fusible element may be formed on the same dielectric layer, base layer, or substrate as the longitudinally spaced segments. In other embodiments, a fusible element may be formed on a separate dielectric layer, and the spaced segments and the fusible element may be sandwiched by the two dielectric layers. In yet other embodiment, a fusible element may be formed as an independent component (e.g., a wire, etc.) that is positioned over the spaced segments. A few example layer constructions for shielding elements that fusible elements are described in greater detail below with reference to FIGS. 5A-5G. A wide variety of other suitable layer constructions may be utilized as desired.

As a result of incorporating one or more fusible elements into a shielding element, a continuous shield layer may be provided that does not need to be grounded on either end. In the event that a potentially dangerous current or charge is present on the shielding element, one or more fusible elements may break down or fuse, thereby severing the electrical continuity of the shielding element. Accordingly, the fusible elements may limit or prevent damage to equipment connected to a cable incorporated the shielding element. In certain embodiments, use of fusible elements may also reduce or limit shock hazards resulting from potentially dangerous currents present on the shielding element. As desired, a minimum fusing current of a fusible element may be based at least in part on equipment tolerances and/or safety standards.

In certain embodiments and as illustrated in FIG. 1, both a separator 110 and an external shield 120 may be incorporated into a cable. For example, a separator 110 may be positioned between a multitude of twisted pairs 105, and an external shield 120 may circumscribe the twisted pairs 105 (or a desired grouping of one or more twisted pairs). Further, both the separator 110 and the external shield 120 may include electrically conductive material. In this regard, the separator 110 may provide for shielding between the twisted pairs, and the external shield 120 may shield the twisted pairs from external signals. As a result of utilizing both a separator 110 and shield 120, the performance of the cable 100 may be similar to a cable in which each of the twisted pairs 105 is individually shielded (i.e., a shielded twisted pair ("STP") cable). In other words, the cable 100 utilizing both a separator and an external shield may function as an alternative to conventional STP cables. However, the cable 100 may be easier to terminate by a technician.

A wide variety of other materials may be incorporated into the cable 100 as desired. For example, in certain embodiments, a respective dielectric separator or demarcator (not shown in FIG. 1) may be positioned between the individual conductive elements or electrical conductors of one or more of the twisted pairs 105. FIGS. 2 and 3 illustrate example cables 200, 300 that includes dielectric separators between the conductive elements of various twisted pairs. In certain embodiments, a dielectric separator may be provided for each of the twisted pairs 105 of a cable 100. In other embodiments, only a portion of the twisted pairs 105 may include a dielectric separator positioned between the individual conductors. In yet other embodiments, no dielectric separators may be provided.

In certain embodiments, a dielectric separator may be woven helically between the individual conductors or conductive elements of a twisted pair 105. In other words, the dielectric separator may be helically twisted with the conductors of the twisted pair 105 along a longitudinal length of the cable 100. In certain embodiments, the dielectric separator may maintain spacing between the individual conductors of the twisted pair 105 and/or maintain the positions of one or both of the individual conductors. For example, the dielectric separator may be formed with a cross-section (e.g., an X-shaped cross-section, an H-shaped cross-section, etc.) that assists in maintaining the position(s) of one or both the individual conductors of the twisted pair 105. In other words, the dielectric separator may reduce or limit the ability of one or both of the individual conductors to shift, slide, or otherwise move in the event that certain forces, such as compressive forces, are exerted on the cable 100. In other embodiments, a dielectric separator may be formed as a relatively simple film layer that is positioned between the individual conductors of a twisted pair 105.

Additionally, in certain embodiments, a dielectric separator may include one or more portions that extend beyond an outer circumference of a twisted pair 105. When the individual conductors of a twisted pair 105 are wrapped together, the resulting twisted pair 105 will occupy an approximately circular cross-section along a longitudinal length of the cable 100, although the cross-section of the twisted pair 105 is not circular at any given point along the longitudinal length. In certain embodiments, a dielectric separator may extend beyond the outer circumference formed by the twisted pair 105. In this regard, the dielectric separator may maintain a desired distance between the twisted pair 105 and a shield layer, such as shield layer 110. Thus, when the shield layer 110 is formed around the twisted pair 105, a circumference of the shield layer 110 will be greater than that of the twisted pair 105. In other embodiments, a dielectric separator may include portions that extend beyond a twisted pair 105 and that are wrapped around the twisted pair 105. As a result, a dielectric separator may be utilized to form a shield layer (e.g., an individual shield layer, etc.) around a twisted pair 105. As desired, electrically conductive shielding material may be incorporated into the portions of a dielectric separator that form a shield layer. Further, in certain embodiments, a shielding portion or section of a dielectric separator may include longitudinally spaced segments of electrically conductive material and respective fusible elements that provide electrical continuity between adjacent spaced segments. In other words, a shielding portion or section of a dielectric separator may be formed in a similar manner as the other shielding elements described herein.

Other materials may be incorporated into a cable 100 as desired in other embodiments. For example, as set forth above, the cable 100 may include any number of conductors, twisted pairs, optical fibers, and/or other transmission media. In certain embodiments, one or more tubes or other structures may be situated around various transmission media and/or groups of transmission media. Additionally, as desired, a cable may include a wide variety of strength members, swellable materials (e.g., aramid yarns, blown swellable fibers, etc.), insulating materials, dielectric materials, flame retardants, flame suppressants or extinguishants, gels, and/or other materials.

FIG. 2 is a cross-sectional view of another example cable 200 that may incorporate at least one shield or shielding element having one or more fusible elements. The cable 200 of FIG. 2 may include components that are similar to the cable 100 illustrated and described above with reference to FIG. 1. Accordingly, the cable 200 may include a plurality of twisted pairs 205A-D disposed in a cable core. A separator 210 may be disposed between at least two of the twisted pairs 205A-D and may function to orient and/or provide desired spacing between two or more of the twisted pairs 205A-D. In some embodiments, the separator 210 may function as a shielding element. Additionally, an outer jacket 215 may enclose the internal components of the cable 200.

With continued reference to FIG. 2, each of the twisted pairs 205A-D may be individually shielded. For example, shield layers 220A-D may respectively be wrapped or otherwise formed around each of the twisted pairs 205A-D. In other words, a first shield layer 220A may be formed around a first twisted pair 205A, a second shield layer 220B may be formed around a second twisted pair 205B, a third shield layer 220C may be formed around a third twisted pair 205C, and a fourth shield layer 220D may be formed around a fourth twisted pair 205D. In other embodiments, a portion or none of the twisted pairs may be individually shielded. Indeed, a wide variety of different shielding arrangements may be utilized in accordance with various embodiments of the disclosure. Additionally, one or more of the shielding elements (e.g., individual pair shields, overall shield, separator, etc.) incorporated into the cable 200 may include a plurality of longitudinally spaced segments of electrically conductive material and one or more respective fusible elements that provide electrical continuity between each longitudinally adjacent set or pair of spaced segments.

Further, the cable 200 includes respective dielectric separators 225A-D positioned between the individual conductors of the respective twisted pairs 205A-D. The dielectric separators 225A-D are formed as dielectric films that may maintain separation between the conductors of the twisted pairs 205A-D. Additionally, in certain embodiments, the dielectric separators 225A-D may extend beyond an outer circumference of the twisted pairs, thereby maintaining a desired separation distance between the twisted pairs 205A-D and the individual pair shields 210A-D. In other embodiments, the dielectric separators 225A-D may extend beyond and be wrapped around an outer periphery of each respective twisted pair. As a result, a dielectric separator may be utilized to form an individual shield around a twisted pair. As desired, a shielding portion of a dielectric separator may be formed with a plurality of longitudinally spaced segments of electrically conductive material and one or more respective fusible elements that provide electrical continuity between each longitudinally adjacent set or pair of spaced segments.

FIG. 3 is a cross-sectional view of another example cable 300 including at least one shield or shielding element having one or more fusible elements. The cable 300 of FIG. 3 may include components that are similar to the cable 100 illustrated and described above with reference to FIG. 1. Accordingly, the cable 300 may include a plurality of twisted pairs 305A-D disposed in a cable core. A separator 310 may be disposed between at least two of the twisted pairs 305A-D and may function to orient and/or provide desired spacing between two or more of the twisted pairs 305A-D. In some embodiments, the separator 310 may function as a shielding element.

The separator 310 illustrated in FIG. 3 has a different construction than the separators 110, 210 illustrated in FIGS. 1 and 2. In particular, the separator 310 is a generally T-shaped separator that approximately bisects (or otherwise divides) the cable core and forms two channels along a longitudinal length of the cable 300 in which the twisted pairs 305A-D are disposed. For example, two twisted pairs 305A, 305B can be disposed in a first channel and the remaining two twisted pairs 305C, 305D can be disposed in a second channel. The T-shaped separator 310 illustrated in FIG. 3 is merely one example of an alternative separator shape, and a wide variety of other separator shapes may be utilized as desired.

With continued reference to FIG. 3, an outer jacket 315 may enclose the internal components of the cable 300. Additionally, any number of shield layers may be utilized to provide shielding for the twisted pairs 305A-D. For example, a first shield layer 320 may be wrapped or otherwise formed around two of the twisted pairs, such as the twisted pairs 305A, 305B disposed in the first channel. A second shield layer 325 may be wrapped or otherwise formed around other twisted pairs, such as twisted pairs 305C, 305D disposed in the second channel. In other words, shield layers may be provided for various groups of twisted pairs disposed within the cable core. Additionally, one or more of the shielding elements (e.g., shield layers, separator, etc.) incorporated into the cable 300 may include a plurality of longitudinally spaced segments of electrically conductive material and one or more respective fusible elements that provide electrical continuity between each longitudinally adjacent set or pair of spaced segments.

Further, the cable 300 of FIG. 3 is illustrated as having dielectric separators 330A-D positioned between the individual conductors of the respective twisted pairs 305A-D. The dielectric separators 330A-D are illustrated as having approximately H-shaped cross-sections, although other suitable cross-sections may be utilized as desired. Each of the dielectric separators 330A-D may provide suitable channels in which the conductors of a twisted pair may be situated. As a result, the dielectric separators 330A-D may maintain the positions of the twisted pairs 305A-D when the cable 300 is subjected to various forces and stresses, such as compressive forces.

The cables 100, 200, 300 illustrated in FIGS. 1-3 are provided by way of example only. Embodiments of the disclosure contemplate a wide variety of other cables and cable constructions. These other cables may include more or less components than the cables 100, 200, 300 illustrated in FIGS. 1-3. For example, other cables may include alternative shielding arrangements and/or different types of separators or fillers. Other cables may also include alternative numbers and/or configurations of dielectric films. Additionally, certain components may have different dimensions and/or materials than the components illustrated in FIGS. 1-3.

Figure 4:
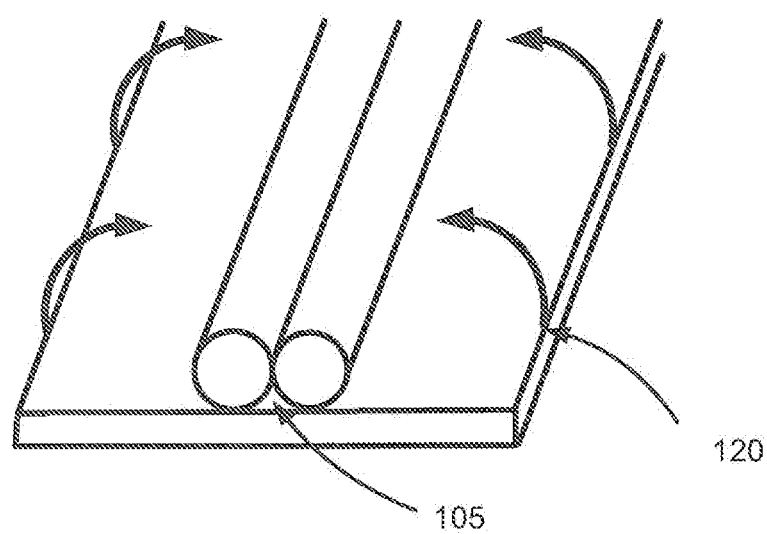
FIG. 4 illustrates an example technique for wrapping one or more twisted pairs with a shield layer in accordance with certain embodiments of the disclosure.

A wide variety of suitable techniques may be utilized as desired to wrap one or more twisted pairs with a shield layer. FIG. 4 illustrates one example technique for wrapping one or more twisted pairs, such as one or more of the twisted pairs 105A-D illustrated in FIG. 1, with a shield layer, such as the shield 120 illustrated in FIG. 1. With reference to FIG. 4, a single twisted pair is illustrated; however, a plurality of twisted pairs may be wrapped with a shield layer. The twisted pair(s) 105 may be positioned adjacent to a shield layer 120, such as a shield layer that includes one or more fusible elements. The twisted pair(s) 105 may extend essentially parallel with the major or longitudinal axis/dimension of the shield layer 120. Thus, the twisted pair(s) can be viewed as being parallel to the surface or plane of the shield layer 120. As desired, the twisted pair(s) 105 may be approximately centered along a width dimension of the shield layer 120. Alternatively, the twisted pair(s) 105 may be positioned closer to one edge of the shield layer 120.

In certain applications, two conductors, which are typically individually insulated, will be twisted together to form a twisted pair 105. The shield layer 120 may then be wrapped around the twisted pair 105. Alternatively, the shield layer 120 may be wrapped around multiple twisted pairs of conductors, such as twisted pairs that have been twisted, bunched, or cabled together. During wrapping, one edge (or both edges) of the shield layer (e.g., the distal edge opposite the edge at which the twisted pair(s) is positioned) may be brought up over the twisted pair(s) 105, thereby encasing the twisted pair(s) 105 or wrapping the shield layer around or over the twisted pair(s) 105. In an example embodiment, the motion can be characterized as folding or curling the shield layer over the twisted pair(s) 105.

In certain embodiments, the shield layer 120 may be wrapped around the twisted pair(s) 105 without substantially spiraling the shield layer 120 around or about the twisted pair(s). Alternatively, the shield layer 120 may be wrapped so as to spiral around the twisted pair(s) 105. Additionally, in certain embodiments, the electrically conductive material incorporated into the shield layer 150 may face away from the twisted pair(s) 105, towards the exterior of a cable. In other embodiments, the electrically conductive material may face inward, towards the twisted pair(s) 105. In yet other embodiments, electrically conductive material may be formed on both sides of a shield layer 120. In one example embodiment, the shield layer 120 and the twisted pair(s) 105 are continuously fed from reels, bins, containers, or other bulk storage facilities into a narrowing chute or a funnel that curls the shield layer over the twisted pair(s).

As set forth above, a shield element (e.g., a shield layer, a separator, etc.) may be formed with a wide variety of suitable layer constructions. FIGS. 5A-5G illustrate a few non-limiting examples of layer constructions that may be utilized for shielding elements in accordance with various embodiments of the disclosure. Any of the shield layers and/or other shielding elements described above with reference to the cables 100, 200, 300 of FIGS. 1-3 may be formed with any of the example layer constructions illustrated in FIGS. 5A-5G, as well as with a wide variety of other suitable layer constructions.

Figure 5A:
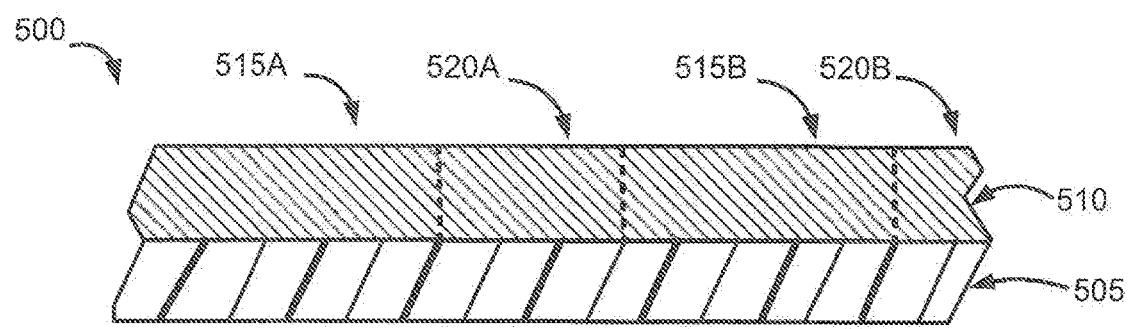
FIGS. 5A-5G illustrate cross-sections for example shielding elements that are formed with fusible elements, in accordance with various embodiments of the disclosure.

FIG. 5A illustrates a first example shielding element 500 that may be utilized in conjunction with one or more twisted pairs and/or other transmission media. In certain embodiments, the shielding element 500 may be formed as a tape or other configuration including a substrate or carrier layer with electrically conductive material formed on the substrate. The shielding element 500 may include a dielectric layer 505, and electrically conductive material 510 may be formed or disposed on one side of the dielectric layer 505. The electrically conductive material 510 may include any number of spaced segments of electrically conductive material 515A, 515B with one or more respective fusible elements 520A, 520B spanning between each set or pair of adjacent spaced segments 515A, 515B. With the combination of spaced segments 515A, 515B and fusible elements 520A, 520B, the electrically conductive material 510 may be continuous along a longitudinal length of the dielectric layer 505 or shielding element 500. For ease of illustration, the cross-section shown in FIG. 5A has been taken along a line that extends through both the spaced segments 515A, 515B and fusible elements 520A, 520B. Because fusible elements may be formed in accordance with a wide variety of different arrangements, other cross-sectional views of the shielding element 500 may not cut through one or more of the fusible elements 520A, 520B. Additionally, FIG. 5A illustrates a shielding element 500 in which the spaced segments 515A, 515B and the fusible elements 520A, 520B have approximately equal or substantially similar thicknesses. In certain embodiments, the spaced segments 515A, 515B and the fusible elements 520A, 520B may be formed from the same electrically conductive material. In other embodiments, the spaced segments 515A, 515B may be formed from a first electrically conductive material, and the fusible elements 520A, 520B may be formed from a second electrically conductive material.

Figure 5B:
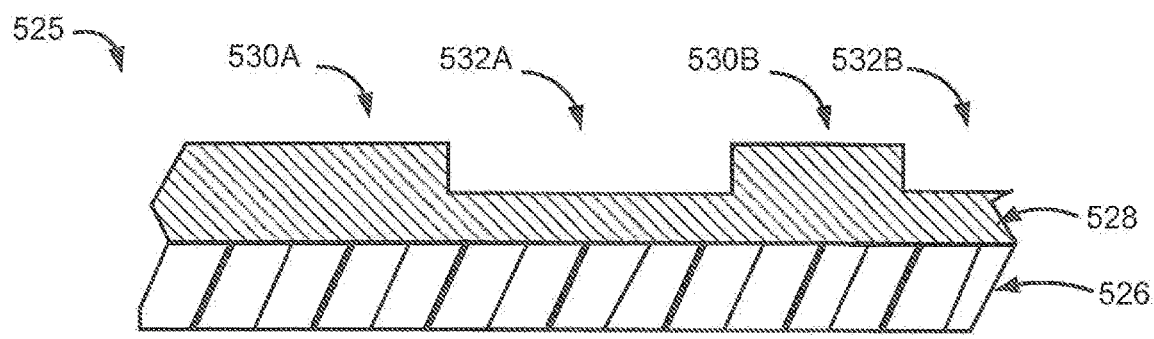

FIG. 5B illustrates another example shielding element 525 that includes a base dielectric layer 526 and electrically conductive material 528 formed on the base layer 526. Similar to the shielding element 500 of FIG. 5A, the electrically conductive material 528 may include any number of spaced segments of electrically conductive material 530A, 530B with one or more respective fusible elements 532A, 532B spanning between each set or pair of adjacent spaced segments 530A, 530B. With the combination of spaced segments 530A, 530B and fusible elements 532A, 532B, the electrically conductive material 528 may be continuous along a longitudinal length of the dielectric layer 526 or shielding element 525. In contrast to the shielding element 500 of FIG. 5A, the shielding element 525 of FIG. 5B may include fusible elements 532A, 532B that have a smaller thickness than the spaced segments 530A, 530B. The smaller thickness may reduce a cross-sectional area of the fusible elements 532A, 532B, thereby reducing a minimum fusing current. In other embodiments, one or more fusible elements 532A, 532B may be formed with variable thicknesses. Additionally, as desired in various embodiments, the fusible elements 532A, 532B may be formed from the same electrically conductive material as the spaced segments 530A, 530B or from different types of electrically conductive material.

Figure 5C:
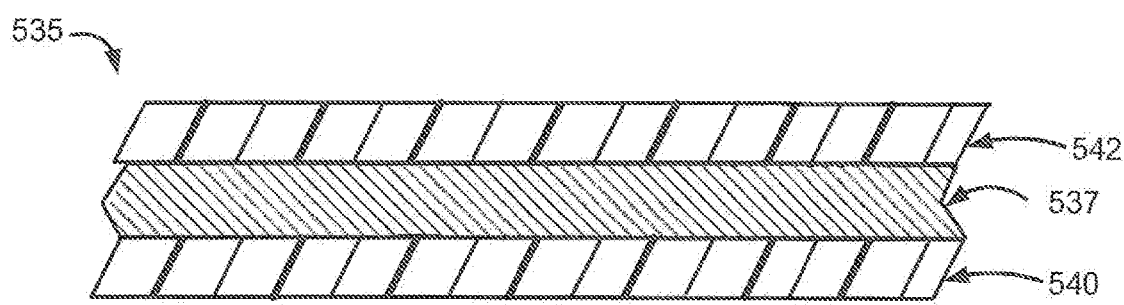
Figure 5D:
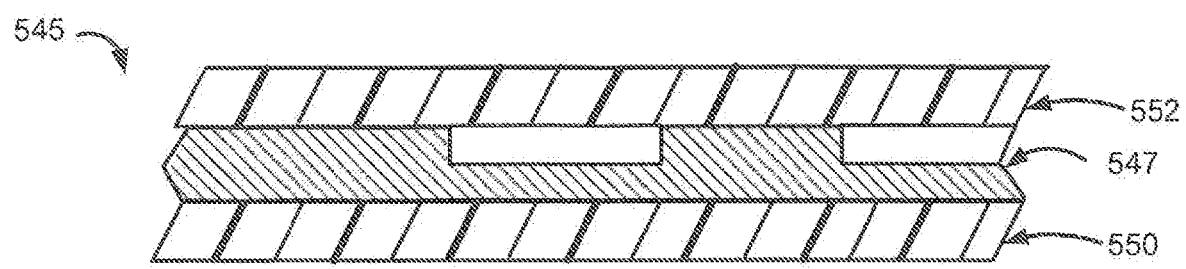

FIG. 5C illustrates an example shielding element 535 in which electrically conductive material 537 is sandwiched between two dielectric layers 540, 542. For example, electrically conductive material 537 that includes both spaced segments and fusible elements may be formed on a first dielectric layer 540. A second dielectric layer 542 may then be formed over the electrically conductive material 537. FIG. 5D illustrates another example shielding element 545 in which electrically conductive material 547 is sandwiched between two dielectric layers 550, 552. The electrically conductive material 547 may include both spaced segments and fusible elements. Similar to the shielding element 525 of FIG. 5B, the fusible elements may have a thickness that is smaller than that of the spaced segments.

Figure 5E:
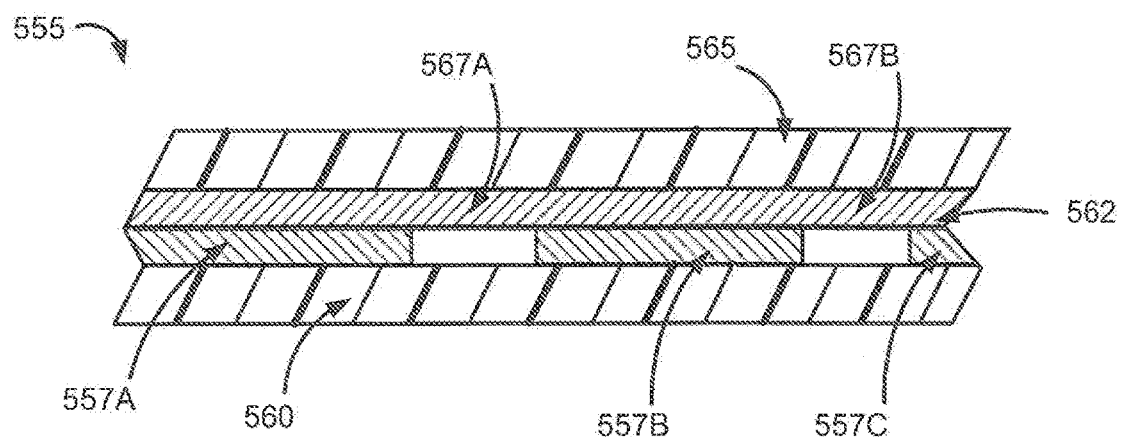

FIG. 5E illustrates an example shielding element 555 in which spaced segments of electrically conductive material 557A, 557B, 557C are formed on a first dielectric layer 560. For example, the spaced segments 557A, 557B, 557C may be formed on a top side of the first dielectric layer 560. As shown, gaps or spaces may be present between each adjacent set of spaced segments. Additionally, second electrically conductive material 562 may be formed on a second dielectric layer 565, for example, on a bottom side or underside of the second dielectric layer 565. As shown, the second electrically conductive material 562 may be continuous along a longitudinal direction. The second electrically conductive material 562 may be brought into contact with the spaced segments 557A, 557B, 557C, and the second electrically conductive material 562 may form fusible elements 567A, 567B between each adjacent set of the spaced segments 557A, 557B, 557C. Additionally, the spaced segments 557A, 557B, 557C and the second electrically conductive material 562 may be sandwiched between the two dielectric layers 560, 565. In other embodiments, relatively continuous second electrically conductive material (e.g., a wire, etc.) may be positioned adjacent to the spaced segments 557A, 557B, 557C in order to form fused elements without having a second dielectric layer.

Figure 5F:
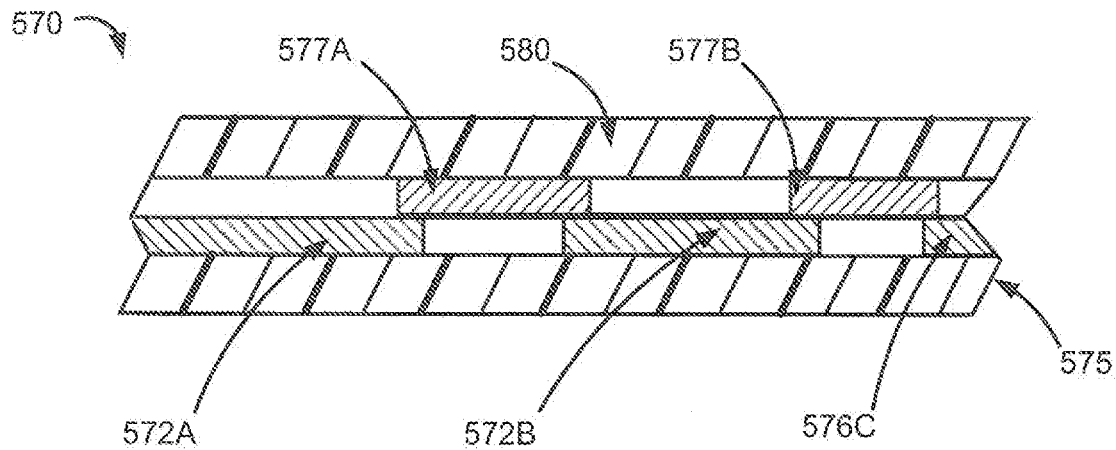

FIG. 5F illustrates another example shielding element 570 in which spaced segments of electrically conductive material 572A, 572B, 572C are formed on a first dielectric layer 575. For example, the spaced segments 572A, 572B, 572C may be formed on a top side of the first dielectric layer 575. As shown, gaps or spaces may be present between each adjacent set of spaced segments. Additionally, second electrically conductive material 577A, 577B may be formed on a second dielectric layer 580, for example, on a bottom side or underside of the second dielectric layer 580. As shown, the second electrically conductive material 577A, 577B may include discontinuous or spaced sections of electrically conductive material. However, when the second electrically conductive material 577A, 577B is brought into contact with the spaced segments 572A, 572B, 572C, the second electrically conductive material 577A, 577B may form fusible elements between each adjacent set of the spaced segments 572A, 572B, 572C. As a result, the shielding element 570 may be electrically continuous along its longitudinal length. Additionally, the spaced segments 572A, 572B, 572C and the second electrically conductive material 577A, 577B may be sandwiched between the two dielectric layers 575, 580.

Figure 5G:
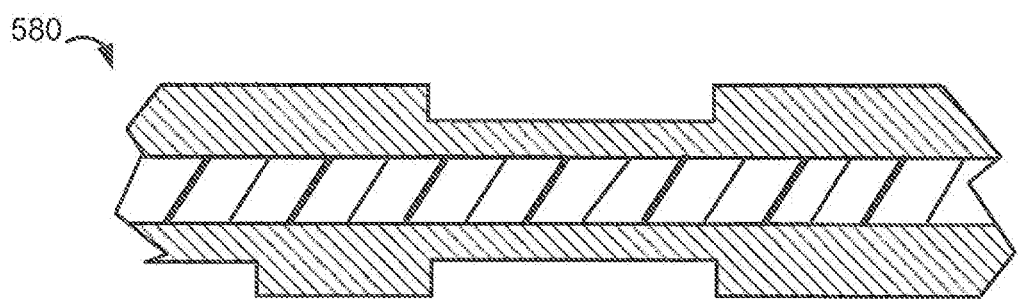

FIGS. 5A-5F illustrate example shielding elements in which spaced segments of electrically conductive material are formed on a single side of a dielectric layer and then electrically connected to one another via fusible elements. In other embodiments, a shielding element may be formed with first spaced segments of electrically conductive material formed on a first side or surface of a dielectric layer and second spaced segments of electrically conductive material formed on a second side or opposite surface of the dielectric layer. A first set of fusible elements may be utilized to electrically connect adjacent segments included in the first spaced segments. As desired in certain embodiments, a second set of fusible elements may be utilized to electrically connect adjacent segments included in the second spaced segments. FIG. 5G illustrates an example layer construction 580 in which respective fusible elements are utilized to electrically connect spaced segments of electrically conductive material on opposite sides of a dielectric layer. Although FIG. 5G illustrates a two-sided variation of the layer construction shown in FIG. 5B, other layer constructions may be utilized to form fusible elements on opposite sides of a dielectric layer including, but not limited to, any of the example layer constructions shown in FIG. 5A, SC. 5D, or 5E and/or a combination of any of the layer constructions shown in FIGS. 5A-5E. It will further be appreciated that a wide variety of other suitable layer constructions may be utilized as desired to form a shielding element in accordance with various embodiments of the disclosure. The layer constructions illustrated in FIGS. 5A-5G are provided by way of non-limiting example only.

A shield element (e.g., a shield layer, a separator, etc.) may also be formed with a wide variety of suitable arrangements of fusible elements. FIGS. 6A-6L illustrate to level views of example configurations or arrangements of fusible elements that may be utilized in association with shielding elements in various embodiments of the disclosure. Any of the shield layers and/or other shielding elements described above with reference to the cables 100, 200, 300 of FIGS. 1-3 may be formed with any of the example fusible element constructions illustrated in FIGS. 6A-6L, as well as with a wide variety of other suitable layer constructions.

Turning first to FIG. 6A, a first example shielding element 600 is illustrated in which a plurality of longitudinally spaced segments 605A-D of electrically conductive material are formed on a dielectric layer 610. For each longitudinally adjacent set or pair of spaced segments (e.g., segments 605A, 605B), at least one of the segments may narrow or taper as it extends towards the adjacent segment. As shown in FIG. 6A, both segments included in a pair of segments (e.g., segments 605A, 605B) may narrow or taper as they extend towards one another. In other embodiments, only a single segment may narrow or taper. For example, a first segment (e.g., segment 605A) may narrow or taper as it approaches a second segment (e.g., 605B) having an edge that is formed perpendicularly across the shield element 600 (i.e., in a widthwise direction perpendicular to the longitudinal direction). As desired, a spaced segment may taper or narrow at any suitable angle or by any other suitable amount. Regardless of whether one or both segments taper or narrow, a fusible element 615 between the two segments (e.g., segments 605A, 605B) may be formed at or proximate to the narrowest point(s) of the taper(s). As explained in greater detail above, in certain embodiments, the fusible element 615 may include portions of the tapering sections or elements that are susceptible to fusing in the presence of a minimum fusing current. In other embodiments, the fusible element 615 may extend across a longitudinal gap or spacing from one or more narrowest point(s) of the taper(s).

FIG. 6B illustrates a second example shielding element 620 in which one or both segments included in a pair of longitudinally adjacent segments tapers or narrows in the longitudinal direction as they approach one another. However, while the shielding element 600 of FIG. 6A includes tapering segments that form a fusible element at or near a widthwise midpoint of the shielding element 600, the shielding element 620 of FIG. 6B includes tapering segments that form a fusible element at or near one widthwise edge of the shielding element 620. As desired, one or more spaced segments may taper in order to form fusible elements at any desired locations positioned between the spaced segments. Further, in certain embodiments, each set of spaced segments may have fusible elements formed at similar widthwise locations. In other embodiments, at least two pairs of spaced segments may have fusible elements formed at different widthwise locations (e.g., at or near opposite widthwise edges, etc.). Additionally, although FIGS. 6A and 6B illustrate shielding elements 600, 620 that include single fusible elements formed between each pair of longitudinally adjacent spaced segments, any suitable number of fusible elements may be formed between each pair of spaced segments. FIG. 6C illustrates an example shielding element 625 in which two fusible elements are formed between each pair of spaced segments. For example, fusible elements may be formed between each set of spaced segments at or proximate two each of the widthwise edges. As desired, the widthwise locations of multiple fusible elements may be similar between each set of adjacent spaced segments or, alternatively, the locations of multiple fusible elements may vary between at least two spaced segments. Further, the number of fusible elements formed between each adjacent set of spaced segments may be constant along a longitudinal length or alternatively, a different number of fusible elements may be formed between at least to sets of spaced segments.

In certain embodiments, a shielding element may include a plurality of longitudinally spaced segments of electrically conductive material, and respective gaps or spaces may be formed between each adjacent set or pair of spaced segments. One or more fusible elements may then span across each longitudinal gap or space in order to provide electrical continuity between the spaced segments. As desired, a gap or space may be formed at any suitable angle between two spaced segments. FIG. 6D illustrates an example shielding element 630 in which gaps are formed at an angle between the longitudinal direction and the perpendicular widthwise direction of the shielding element 630. As explained in greater detail above, angled gaps or spaces may provide improved shielding performance in certain embodiments. By contrast, FIGS. 6E-6L illustrate example shielding elements in which gaps are formed at a perpendicular (e.g., 90 degree) angle to the longitudinal direction (e.g., along the widthwise direction). Any of the shielding elements of FIGS. 6E-6L may include gaps formed at different angles. Regardless of the angle at which a gap is formed, one or more fusible elements may extend across a gap in any suitable direction and/or combinations of directions and/or at any suitable widthwise location(s). The shielding element 630 of FIG. 6D includes fusible elements 632A, 632B that are positioned proximate to one of the widthwise edges of the shielding element 630. In other embodiments, fusible elements may be positioned at other widthwise locations or in a plurality of different widthwise locations.

Figure 6E:
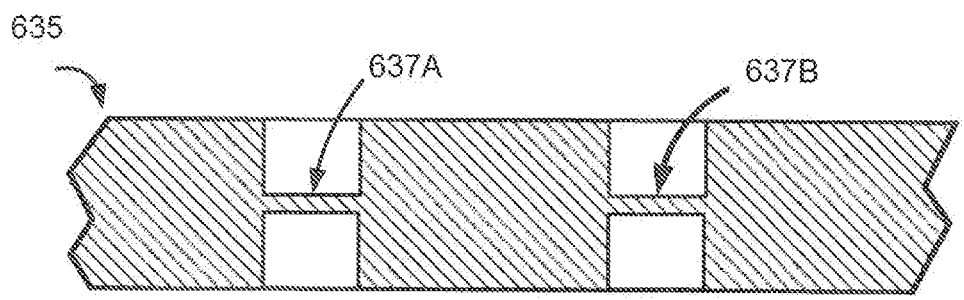
Figure 6F:
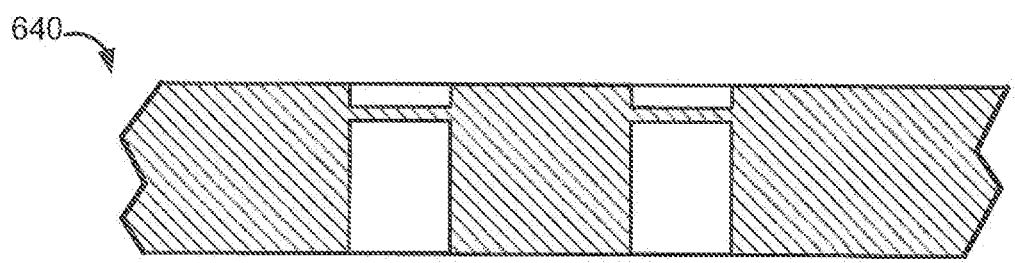

FIG. 6E illustrates an example shielding element 635 in which fusible elements 637A, 637B extend across gaps or spaces between adjacent spaced segments in a longitudinal direction. For example, fusible elements 637A, 637B may extend across a respective gap or space with the shortest possible overall length. In other words, a length of a fusible element 637A, 637B may correspond to the longitudinal length of the gap or space. Additionally, the shielding element of FIG. 6E illustrates fusible elements 637A, 637B that are formed at or proximate to a widthwise midpoint of the shielding element 635. FIG. 6F illustrates an example shielding element 640 in which fusible elements are formed between spaced segments at or near a widthwise edge of the shielding element 640. As desired, various fusible elements may be formed at any suitable widthwise location and/or combinations of widthwise locations (for example, as shown in FIG. 6J).

Figure 6G:
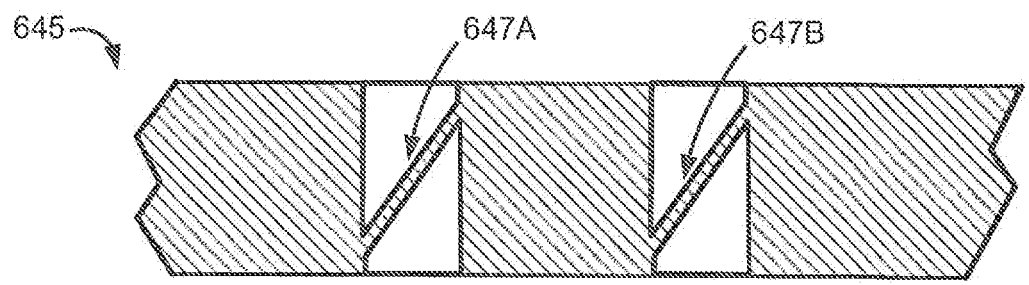

FIG. 6G illustrates an example shielding element 645 in which one or more fusible elements 647A, 647B span between respective pairs of spaced segments at an angle relative to the longitudinal direction of the shielding element 645. The angle may result in a fusible element (generally referred to as fusible element 647) having a length that is greater than the longitudinal length of the gap or space between two spaced segments. The longer length of the fusible element 647 may increase or enhance the likelihood that the fusible element may fuse in the event that a minimum fusing current is applied. Additionally, in certain embodiments, the angled direction of the fusible element 647 may reduce the likelihood of severing or damaging the fusible element 647 in the event that stresses or forces are exerted on the shielding element 645, such as stretching or twisting forces. A fusible element 647 may extend across a gap at any suitable angle as desired in various embodiments of the disclosure, such as an angle of approximately 25, 30, 35, 40, or 45 degrees relative to the longitudinal direction, at an angle included in a range between any two of the above values, or at an angle included in a range bounded on either a minimum or maximum end by one of the above values.

Figure 6H:
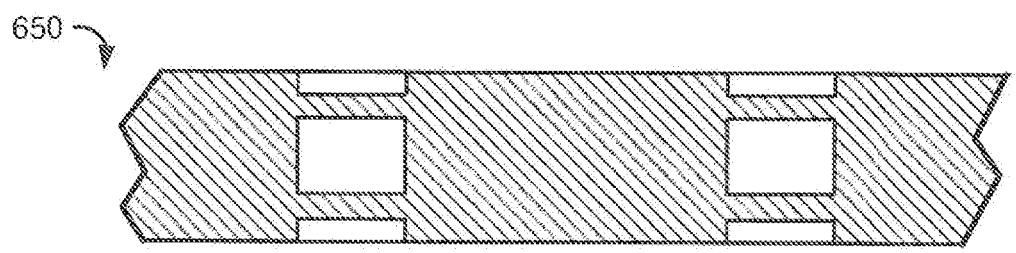

As shown in FIGS. 6E-6G, certain shielding elements may include a single fusible element that extends between each pair of longitudinally adjacent spaced segments. In other embodiments, a plurality of fusible elements may be provided between one or more sets of adjacent spaced segments. FIG. 6H illustrates an example shielding element 650 in which two fusible elements extend or span between each pair of longitudinally adjacent spaced segments. Other suitable numbers of fusible elements may be utilized between spaced segments as desired in other embodiments. Additionally, in certain embodiments, the same number of fusible elements may extend between each respective pair of spaced segments. In other embodiments, a different number of fusible elements may extend between at least two respective pairs of spaced segments. Further, the shielding element 650 of FIG. 6H illustrates fusible elements that extend along the longitudinal direction. As desired in other embodiments, one or more of the fusible elements may extend at an angle relative to the longitudinal direction or in any other suitable direction or combination of directions.

Figure 6I:
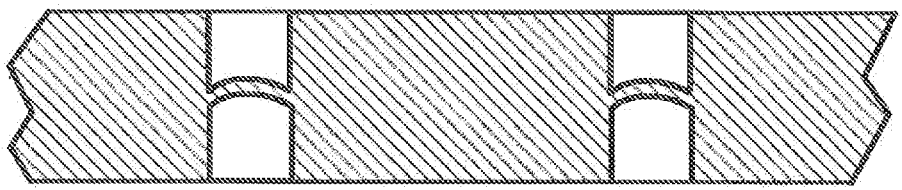
Figure 6J:
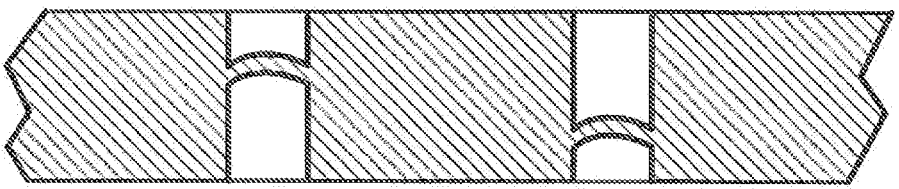

In certain embodiments, a shielding element may include one or more fusible elements that extend between spaced segments in a direction that includes at least one curve or arc. FIG. 6I illustrates an example shielding element 655 in which fusible elements extend between spaced segments with a curved or arcuate shape. In other embodiments, a fusible element may extend between spaced segments with a sinusoidal shape or any other suitable shape that includes at least one curve. The fusible elements of FIG. 6I are positioned near a widthwise midpoint of the shielding element 655. FIG. 6J illustrates another example shielding element 660 in which curved or arcuate fusible elements are positioned at other widthwise locations, such as proximate to one or both widthwise edges. In certain embodiments, fusible elements may be positioned at similar widthwise locations. In other embodiments, as shown in FIG. 6J, at least two fusible elements may be positioned at different widthwise locations. A curve incorporate into a fusible element may be formed with any suitable degree of curvature. As a result of being formed with a shape or in a direction that includes at least one curve or arc, an overall length of a fusible element may be increased, thereby increasing a likelihood of fusing. Additionally, incorporation of a curve or arc may reduce the likelihood of severing or damaging a fusible element in the event that stresses or forces are exerted on a shielding element. For example, if a shielding element is stretched during manufacture, transport and/or installation of a cable, a curved fusible element may be less likely to break or sever.

Figure 6K:
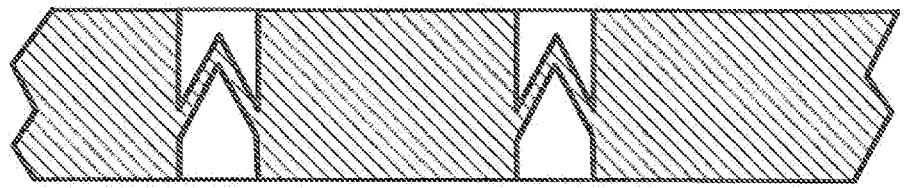
Figure 6L:
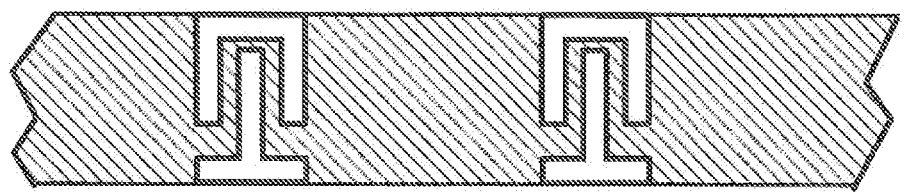

As set forth above, one or more benefits may be provided as a length of a fusible element is increased. It will be appreciated that a wide variety of different fusible elements may be formed between two spaced segments that include a length longer than that of a gap formed between the segments. These fusible elements may include any number of curves, bends, angles, and/or other direction variations that result in a longer length. For example, FIG. 6K illustrates an example shielding element 665 in which one or more fusible elements include a "V-shape" resulting in an elongated fusible element with an acute angle formed therein. FIG. 6L illustrates an example shielding element 670 in which one or more fusible elements include a plurality of right angle bends that result in the fusible element having an elongated width. In other embodiments, fusible elements may extend in a wide variety of other combinations of directions in order to span a gap between spaced segments.

FIGS. 6A-6L illustrate a few non-limiting examples of fusible element arrangements or configurations that may be incorporated into a shielding element. A wide variety of other fusible element configurations may be utilized as desired. These configurations may include any number of fusible elements that extend in a wide variety of suitable directions. Further, a shielding element may be formed that incorporates any suitable combination of the fusible element configurations described above with reference to FIGS. 6A-6L.

In certain embodiments, a shielding element may include longitudinally spaced segments of electrically conductive material formed on a base dielectric layer. Separate electrically conductive material may then be brought into contact with the spaced segments in order to form one or more fusible elements between each adjacent pair of spaced segments. For example, a topcoat or top layer of electrically conductive material may be positioned over the spaced segments. In certain embodiments, the topcoat may include only second electrically conductive material that is brought into contact with the spaced segments. In other embodiments, the topcoat may include second electrically conductive material that is formed on a second dielectric layer, for example, on an underside of a second dielectric layer. In certain embodiments, when the second electrically conductive material is brought into contact with the spaced segments, the two dielectric layers may sandwich the spaced segments and the fusible elements. FIGS. 7A-7E illustrate example configurations of electrically conductive material that may be utilized to form fusible elements between discontinuous shield patches in various embodiments of the disclosure. Any of the configurations illustrated in FIGS. 7A-7E may be utilized to form a topcoat or top layer over spaced segments or discontinuous patches (e.g., spaced segments with gaps formed between each adjacent set of segments, etc.) of a shield layer. For example, any of the configurations illustrated in FIGS. 7A-7E may be utilized to form the top layer(s) of any of the layer configurations shown in FIGS. 5E and 5F.

Figure 7A:
FIGS. 7A-7E illustrate example configurations of electrically conductive material that may be utilized to form fusible elements between discontinuous shield patches in various embodiments of the disclosure.

FIG. 7A illustrates a first example configuration 700 of electrically conductive material that may be positioned over spaced segments of electrically conductive material in order to form fusible elements. The configuration 700 may include longitudinally continuous electrically conductive material. For example, the configuration 700 may be formed as an uninsulated wire or other continuous formation of material. When positioned adjacent to spaced longitudinal segments, the wire or other formation of material may form fusible elements between pairs of spaced segments. As desired in other embodiments, a plurality of wires may be utilized to form fusible elements. Additionally, in certain embodiments, a wire may extend in a longitudinal direction. In other embodiments, a wire may include one or more bends or curves as it extends in the longitudinal direction.

Figure 7B:
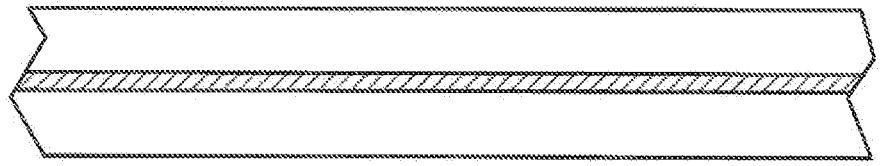

In other embodiments, second electrically conductive material that forms fusible elements between spaced segments disposed on a first dielectric layer may be formed on a second dielectric layer. The second dielectric material may be formed with a wide variety of suitable dimensions (e.g., thicknesses, cross-sectional areas, widths, etc.). Additionally, the second dielectric material may longitudinal extend along the second dielectric material in a wide variety of suitable directions and/or combinations of directions. FIG. 7B illustrates an example configuration 705 in which electrically conductive material extends along a second dielectric layer in a longitudinal direction. The electrically conductive material may be positioned at a wide variety of widthwise locations along the second dielectric layer. When the configuration 705 of FIG. 7B is positioned adjacent to spaced segments, then electrically conductive material of the configuration may form fusible elements.

Figure 7C:
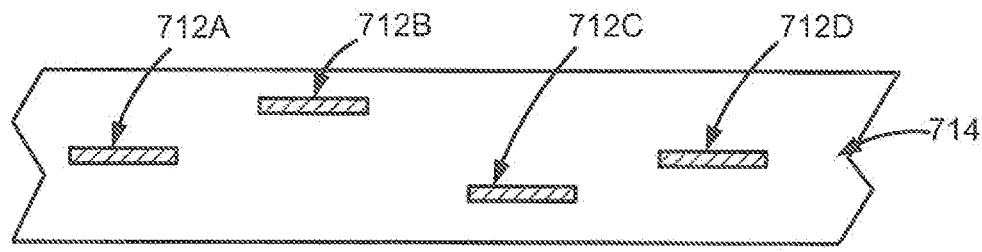

FIG. 7C illustrates an example configuration 710 in which a plurality of sections of electrically conductive material 712A-D are formed on a second dielectric layer 714. Each section of electrically conductive material 712A-D may be formed with a wide variety of suitable lengths and/or other dimensions (e.g., width, thickness, cross-sectional area, etc.). Additionally, each section 712A-D may be positioned at any suitable location along a widthwise direction of the second dielectric layer. In certain embodiments, a plurality of sections may be positioned at similar widthwise locations. In other embodiments, as shown in FIG. 7C, at least two sections may be positioned at different widthwise locations. Further, the plurality of sections 712A-D may be arranged on the second dielectric layer 714 such that their longitudinal positions correspond to gaps or spaces between longitudinal spaced segments formed on a first dielectric layer. As a result, fusible elements may be formed when the sections of electrically conductive material 712A-D and the second dielectric layer 714 are positioned over the first dielectric layer and spaced segments. In certain embodiments, as shown in FIG. 7C, one or more of the sections 712A-D may extend in a longitudinal direction. In other embodiments, one or more sections may extend at one or more angles relative to the longitudinal direction and/or may include one or more curves and/or bends.

Figure 7D:
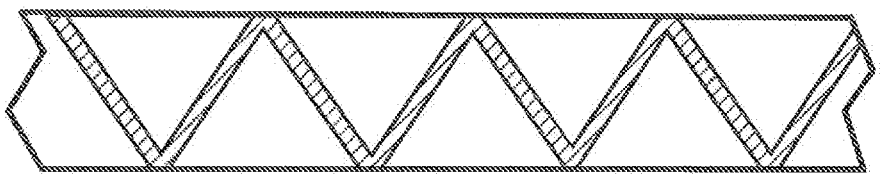
Figure 7E:
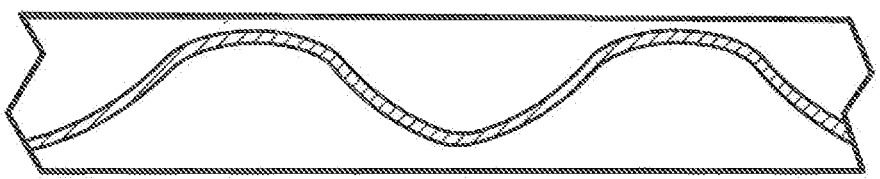

FIG. 7D illustrates an example configuration 715 in which in which electrically conductive material extends along a second dielectric layer in longitudinally extending zigzag. When the configuration 715 of FIG. 7D is positioned adjacent to spaced segments, then electrically conductive material of the configuration 715 may form fusible elements between the spaced segments. Additionally, the fusible elements may longitudinally extend between spaced segments at angles relative to the longitudinal direction. Similarly, FIG. 7E illustrates an example configuration 720 in which in which electrically conductive material extends along a second dielectric layer in longitudinally extending sinusoid. When the configuration 720 of FIG. 7E is positioned adjacent to spaced segments, then electrically conductive material of the configuration 729 may form fusible elements between the spaced segments that include one or more curves. As desired, the configurations 715, 720 of FIGS. 7D and 7E may be formed with a plurality of sections of electrically conductive material rather than longitudinally continuous electrically conductive material. The sections of electrically conductive material may have longitudinal spacings or positioning that correspond to gaps formed between spaced segments. A wide variety of other top layer or top coat configurations may be utilized as desired in various embodiments. FIGS. 7A-7E illustrate are provided by way of non-limiting example only.

Conditional language, such as, among others, "can," "could," "might." or "may." unless specifically stated otherwise, or otherwise understood within the context as used, is generally intended to convey that certain embodiments could include, while other embodiments do not include, certain features, elements, and/or operations. Thus, such conditional language is not generally intended to imply that features, elements, and/or operations are in any way required for one or more embodiments or that one or more embodiments necessarily include logic for deciding, with or without user input or prompting, whether these features, elements, and/or operations are included or are to be performed in any particular embodiment.

Many modifications and other embodiments of the disclosure set forth herein will be apparent having the benefit of the teachings presented in the foregoing descriptions and the associated drawings. Therefore, it is to be understood that the disclosure is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. An electrically continuous shield for use in a cable, the shield comprising:
    a first base layer of dielectric material extending in a longitudinal direction;
    a plurality of longitudinally spaced segments of first electrically conductive material formed on the first base layer, wherein a respective gap is positioned between each adjacent set of longitudinally spaced segments included in the plurality of longitudinally spaced segments;
    a second base layer of dielectric material formed over the plurality of longitudinally spaced segments opposite the first base layer; and
    second electrically conductive material formed on the second base layer facing the plurality of longitudinally spaced segments, wherein the second electrically conductive material comprises one or more fusible elements comprising a respective fusible element that extends across the respective gap between each adjacent set of longitudinally spaced segments included in the plurality of longitudinally spaced segments, each fusible element providing electrical continuity between the adjacent set of longitudinally spaced segments and each fusible element having a minimum fusing current between 0.001 amperes and 0.500 amperes.

2. The shield of claim 1, wherein each fusible element is configured to break down in a maximum time period defined by the equation:

$$T_F = 0.0434/(C_F^{1.213}),$$

wherein $T_F$ is the maximum time period in seconds and $C_F$ is the minimum fusing current in amperes.

3. The shield of claim 1, wherein the second electrically conductive material is different than the first electrically conductive material.

4. The shield of claim 1, wherein each of the plurality of longitudinally spaced segments spans across the first base layer in a widthwise direction perpendicular to the longitudinal direction.

5. The shield of claim 1, wherein at least one fusible element included in the one or more fusible elements spans across the gap between one of the adjacent sets of longitudinally spaced segments at an angle relative to the longitudinal direction.

6. The shield of claim 1, wherein at least one fusible element included in the one or more fusible elements spans across the gap between one of the adjacent sets of longitudinal spaced segments in a direction comprising at least one curve.

7. The shield of claim 1, wherein the second electrically conductive material is continuous along the longitudinal direction.

8. The shield of claim 1, wherein at least one adjacent set of longitudinally spaced segments comprises a first segment having a width that tapers in the longitudinal direction as it extends towards a second segment, and
    wherein the respective fusible element that extends across the gap between the first segment and the second segment is positioned at a portion of the first segment having a narrowest width.

9. An electrically continuous shield for use in a cable, the shield comprising:
    a first base layer of dielectric material extending in a longitudinal direction;
    a plurality of longitudinally spaced segments of first electrically conductive material formed on the first base layer, wherein a respective gap is positioned between each adjacent set of the longitudinally spaced segments;
    a second base layer of dielectric material formed over the plurality of longitudinal spaced segments opposite the first base layer; and
    second electrically conductive material formed on the second base layer facing the plurality of longitudinally spaced segments, the second electrically conductive material continuous along the longitudinal direction and forming a plurality of fusible elements comprising a respective fusible element spanning between each adjacent set of the longitudinally spaced segments, each fusible element providing electrical continuity between the adjacent set of longitudinally spaced segments and each fusible element having a minimum fusing current between 0.001 amperes and 0.500 amperes.

10. The shield of claim 9, wherein each fusible element is configured to break down in a maximum time period defined by the equation:

$$T_F = 0.0434/(C_F^{1.213}),$$

wherein $T_F$ is the maximum time period in seconds and $C_F$ is the minimum fusing current in amperes.

11. The shield of claim 9, wherein the second electrically conductive material is different than the first electrically conductive material.

12. The shield of claim 9, wherein at least one fusible element included in the plurality of fusible elements spans across the gap between one of the adjacent sets of longitudinally spaced segments at an angle relative to the longitudinal direction.

13. The shield of claim 9, wherein at least one fusible element included in the plurality of fusible elements spans across the gap between one of the adjacent sets of longitudinal spaced segments in a direction comprising at least one curve.

14. The shield of claim 9, wherein at least one adjacent set of the longitudinally spaced segments comprises a first segment having a width that tapers in the longitudinal direction as it extends towards a second segment, and
   wherein the respective fusible element that extends across the gap between the first segment and the second segment is positioned at a portion of the first segment having a narrowest width.

15. An electrically continuous shield for use in a cable, the shield comprising:
   a first base layer of dielectric material extending in a longitudinal direction;
   a plurality of longitudinally spaced segments of first electrically conductive material formed on the first base layer, with respective gaps formed between each adjacent set of the longitudinally spaced segments; and
   a longitudinally continuous element comprising a second base layer of dielectric material and second electrically conductive material formed on the second base layer in contact with the plurality of longitudinally spaced segments, wherein the second electrically conductive material forms respective fusible elements between each adjacent set of the longitudinally spaced segments, each of the respective fusible elements having a minimum fusing current between 0.001 amperes and 0.500 amperes.

16. The shield of claim 15, wherein each fusible element is configured to break down in a maximum time period defined by the equation:

$$T_F = 0.0434/(C_F^{1.213}),$$

wherein $T_F$ is the maximum time period in seconds and $C_F$ is the minimum fusing current in amperes.

17. The shield of claim 15, wherein the second electrically conductive material comprises a wire.

18. The shield of claim 15, wherein at least one adjacent set of the longitudinally spaced segments comprises a first segment having a width that tapers in the longitudinal direction as it extends towards a second segment, and
   wherein the respective fusible element that extends across the gap between the first segment and the second segment is positioned at a portion of the first segment having a narrowest width.

* * * * *